(12) United States Patent
Yokoyama et al.

(10) Patent No.: US 6,323,507 B1
(45) Date of Patent: Nov. 27, 2001

(54) SEMICONDUCTOR PHOTONIC ELEMENT, METHOD OF FABRICATING THE SAME, AND SEMICONDUCTOR PHOTONIC DEVICE EQUIPPED THEREWITH

(75) Inventors: Yoshitaka Yokoyama; Koji Kudo; Masayoshi Tsuji, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/488,508

(22) Filed: Jan. 20, 2000

(30) Foreign Application Priority Data

Jan. 21, 1999 (JP) .................................................. 11-013638

(51) Int. Cl.$^7$ .................................................. H01L 33/00
(52) U.S. Cl. .................................. 257/79; 257/94; 372/45; 372/49
(58) Field of Search ............................... 257/94, 96, 97, 257/98; 372/43, 44, 45, 49

(56) References Cited

U.S. PATENT DOCUMENTS

| 5,438,583 | * | 8/1995 | Narui et al. | 372/45 |
| 5,692,002 | * | 11/1997 | Mizutani | 372/46 |
| 5,956,360 | * | 9/1999 | Bylsma et al. | 372/45 |
| 6,084,251 | * | 7/2000 | Tamamura et al. | 257/94 |

FOREIGN PATENT DOCUMENTS

| 11-4038 | 1/1999 | (JP) . |
| 11-261156 | 9/1999 | (JP) . |
| 11-317563 | 11/1999 | (JP) . |

OTHER PUBLICATIONS

Appl. Phys. Lett, vol. 65, No. 25, pp. 3221–3223.
IEEE Photonics Technology Letters, vol. 11, No. 1, pp. 3–5.
"1.3 um GaInAsP SL–QW Al–oxide confined inner stripe lasers on p–InP substrate with AlInAs–oxide confinement layer", by N. Iwai, et al., electronics Letters, vol. 34, No. 14, pp. 1427–1428, Jul. 9, 1998.

(List continued on next page.)

Primary Examiner—Ngân V. Ngô
(74) Attorney, Agent, or Firm—Scully, Scott, Murphy & Presser

(57) ABSTRACT

A semiconductor photonic element is provided, which realize low threshold current and satisfactory characteristics in the high temperatures and/or high output operating condition. This element is comprised of (a) a semiconductor substrate; (b) a mesa structure formed on a first surface of the substrate to extend in a specific direction; the mesa structure including an active layer and a pair of p- and n-type cladding layers located respectively at top and bottom sides of the active layer, forming a double heterojunction; (c)a current-constricting structure for constricting an injection current formed at each side of the mesa structure to expose a top of the mesa structure from the current-constricting structure; the current-constricting structure comprising a first current-blocking part and a second current-blocking part; the first current-blocking part having a dielectric current-blocking layer that extends to the mesa structure; the dielectric current-blocking layer being contacted with top edges of the mesa structure; the second current-blocking part having a semiconductor current-blocking layer; and (d) a semiconductor burying layer formed to cover the mesa structure and the multilayer current-constricting structure; the semiconductor burying layer being contacted with the top of the mesa structure.

13 Claims, 14 Drawing Sheets

OTHER PUBLICATIONS

"1.5 um buried heterostructure InGaAsP/InP MQW laser with native–oxidized InAlAs current blocking layer", by Wang Zhi Jie, et al., 16th Semiconductor Laser International Conference Digest, pp. 157–158, 1998.

Patent Abstract of Japan Application No: 10062389, Publication date Sep. 24, 1999.

Patent Abstract of Japan Application No: 06286553, Publication date Jun. 7, 1996.

Patent Abstract of Japan Application No: 10123498, Publication date Nov. 16, 1999.

JIE W Z et al: "Native Oxidized Inalas Blocking Layer Buried Heterostructure Ingaasp–Inp Mqw Laser For High–Temperature Operation" Iee Photonics Technology Letters, US IEE Inc. New York, vol. 11, No. 1, Jan. 1999, pp. 3–5.

Yamazaki H. et al: "Planar–Buried–Heterostructure Laser Diodes With Oxidized Alas Insulating Current Blocking" Conference Digest. islc 1998 nara. 1998 Iee 16th International Semiconductor Laser Conference Nara, Japan, Oct. 4–8 1998, vol. 5 No. 3 Pp. 688–693.

\* cited by examiner

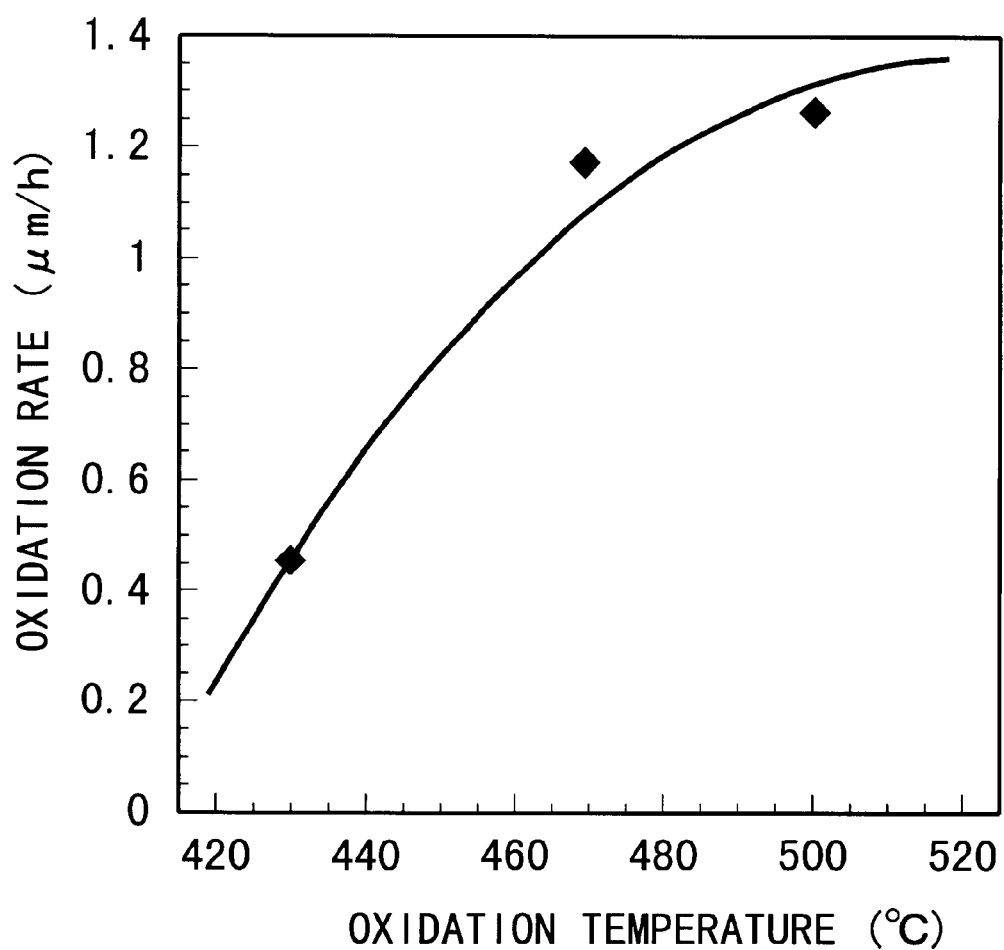

SEMICONDUCTOR PHOTONIC ELEMENT, METHOD OF FABRICATING THE SAME, AND SEMICONDUCTOR PHOTONIC DEVICE EQUIPPED THEREWITH

BACKGROUND OF THE INVENTION

1. Field of the Invention

The present invention relates to a semiconductor photonic element such as a semiconductor laser having a multilayer current-constricting structure, a method of fabricating the element, and a semiconductor photonic device using the element.

2. Description of the Prior Art

In recent years, to realize semiconductor lasers having excellent characteristics such as low threshold current, high efficiency, and high output, there has been the strong need to form a high-performance current-constricting structure thereby increasing the injection efficiency of a driving current. To meet the need, conventionally, various improvements have ever been made for the current-constricting structure.

FIG. 1 shows a partial cross-section of a prior-art semiconductor laser of this sort, in which a conventional current-constricting structure is used.

As shown in FIG. 1, the prior-art semiconductor laser 100 comprises an n-type InP substrate 101, and a mesa structure 140 formed on an upper main surface of the substrate 101, and a current-constricting structure 150 formed on the surface of the substrate 101 at each side of the mesa structure 140. The mesa structure 140 includes an n-type InP cladding layer 102 formed on the surface of the substrate 101, a semiconductor active layer 103 formed on the layer 102, and a p-type InP cladding layer 104 formed on the layer 103. The current-constricting structure 150 includes a p-type InP current-blocking layer 105 formed on the surface of the substrate 101, and an n-type InP current-blocking layer 106 formed on the layer 105.

A p-type InP burying layer 107 is formed to cover the mesa structure 140 and the current-constricting structure 150. A p-type InGaAs contact layer 108 is formed on the layer 107. A p-side electrode 109 is formed on the layer 108. An n-side electrode 110 is formed on a lower main surface of the substrate 101.

As seen from FIG. 1, the current-constricting structure 150 is formed by the p- and n-InP current-blocking layers 105 and 106, which intervene between the n-type InP substrate 101 and the p-type InP burying layer 107. Thus, the prior-art semiconductor laser of FIG. 1 has a pnpn structure (i.e., the thyristor structure), which causes the following problem.

It is supposed that a leakage current flows from the point A in the burying layer 107 to the point B in the substrate 101. In this case, this leakage current serves as a gate current of the thyristor structure and as a result, a leakage current (which serves as an anode current of the thyristor structure) tends to flow from the point C in the burying layer 107 to the point D in the substrate 101, as shown in FIG. 1. Accordingly, the undesired turn-on tends to occur in the thyristor structure, thereby losing the current-constricting function of the current-constricting structure 150. When the prior-art laser 100 operates in a high-temperature and/or high-output condition where the leakage current becomes large, the undesired turn-on often occurs in particular.

As described above, although the current-constricting structure 150 in the prior-art semiconductor laser 100 of FIG. 1 is effective for lowering the threshold current, it has the above-identified problem due to the undesired turn-on in the thyristor structure.

FIG. 2 shows a partial cross-section of a prior-art semiconductor laser of this sort using an improved current-constricting structure for suppressing the above-described undesired turn-on problem.

The prior-art semiconductor laser 200 of FIG. 2 has the same configuration as that of the prior-art semiconductor laser 100 of FIG. 1 except that a current-constricting structure 250 including two mesa structures 251 is used instead of the current-constricting structure 150. Therefore, the explanation about the same configuration is omitted here for simplification of description by attaching the same reference symbols as those used in FIG. 1 to corresponding elements in FIG. 2.

Each of the mesa structures 251 in the current-constricting structure 250 includes an n-type InP layer 202 formed on the upper main surface of the substrate 101, an InGaAsP recombination layer 212 formed on the layer 202, and a p-type InP layer 204 formed on the layer 212. The structures 251 are located under the p-type InP blocking layer 105 at each side of the mesa structure 140 having the active layer 103.

The recombination layer 212 serves to cancel the leakage current (which serves as the anode current of the thyristor) due to carrier recombination, thereby decreasing the current gain factor of the thyristor structure. Thus, the unwanted turn-on of the thyristor structure can be suppressed.

Another improved current-constricting structure using a dielectric layer is disclosed in the paper written by N. Iwai et al., Electronics Letters, Vol. 34, No. 14, pp. 1427–1428, Jul. 9, 1998. FIGS. 3A and 3B show partial cross-sections showing the fabrication method of a prior-art semiconductor laser of this sort, which has the improved current-constricting structure disclosed in this paper.

First, as shown in FIG. 3A, a p-type InP layer 317 with a thickness of 50 nm is formed on an upper main surface of a p-type InP substrate 316. Then, a p-type InAlAs layer 314 with a thickness of 50 nm is formed on the layer 317, and a p-type InP layer 321 with a thickness of 100 nm is formed on the layer 314. A Multiple Quantum Well (MQW) active layer 303, which is formed by alternately stacking InGaAsP barrier sublayers and InGaAsP well sublayers, is formed on the layer 321. An n-type InP layer 315 is formed on the layer 303. An n-type InGaAs contact layer 318 is formed on the layer 315. These layers 317, 314, 321, 303, 315, and 318 are formed by using the Metal Organic Vapor Phase Epitaxy (MOVPE) technique.

Subsequently, channels 320 are formed to reach the underlying InP substrate 316 through the layers 318, 315, 303, 321, 314, and 317, thereby forming a mesa structure 328, as shown in FIG. 3A. For example, the pitch of the channels 320 (i.e., the width of the mesa structure 328) is set as approximately 10 $\mu$m.

Following this, the substrate 316 having the structure of FIG. 3A is placed in an oxidation furnace, thereby selectively oxidizing the p-type InAlAs layer 314 to form a dielectric layer 319 while only the strip-shaped middle mart of the layer 314 is not oxidized, as shown in FIG. 3B. The oxidation of the layer 314 begins at its ends exposed to the channels 320, and progresses laterally toward the center of the layer 314. The middle part of the layer 314 serves as the current injection region through which a driving current is injected. The oxidation period is adjusted so that the remaining middle part of the layer 314 has a width of approximately 4.6 $\mu$m. For example, it is set as 150 minutes.

Furthermore, a silicon dioxide ($SiO_2$) layer 313 is formed on the n-type InGaAs contact layer 318 and the inner walls of the channels 320. A strip-shaped window 313a is formed in the layer 313 to be overlapped with the remaining InAlAs layer 314. An n-side electrode 310 is formed on the $SiO_2$ layer 313. A p-side electrodes 311 is formed on the lower main surface of the substrate 316. Thus, the prior-art semiconductor laser 300 is fabricated, as shown in FIG. 3B.

In the prior-art semiconductor Laser 300 shown in FIG. 38, the dielectric layer 319 serves as a current-blocking layer. When the length of the resonator (i.e., the optical waveguide) is set as 300 μm and high-reflectance coating with a 96% reflectance is applied to the rear end of the waveguide, the obtainable threshold current for continuous oscillation at 25° C. is 18 mA and the obtainable slope efficiency is 0.55 W/A.

A further improved current-constricting structure using a dielectric layer is disclosed in the 16th Semiconductor Laser International Conference Digest, pp. 157–158, 1998, which was reported by Wang Zhi Jie et al. FIGS. 4A and 4B show partial cross-sections showing the fabrication method of a prior-art semiconductor laser 400 of this sort, which includes the improved current-constricting structure disclosed in this digest.

As shown in FIG. 4A, first, an n-type InP cladding layer 402 is formed on the whole upper main surface of an n-type InP substrate 416. Then, a MQW active layer 403, which is formed by alternately stacking InGaAsP barrier sublayers and InGaAsP well sublayers, is formed on the layer 402. A p-type InP cladding layer 404 is formed on the layer 403. These layers 402, 403, and 404 are formed by using the MOVPE technique.

Next, the stacked layers 402, 403, and 404 are selectively etched to form a strip-shaped mesa structure 440 on the surface of the substrate 416. For example, the mesa structure 440 is 2 μm in width and 0.6 μm in height.

Thereafter, a p-type InP layer 415 with a thickness of 0.65 μm is formed on the main surface of the substrate 416 to cover the mesa structure 440. A p-type InAlAs layer 414 with a thickness of 100 nm, which is used for making a current-blocking dielectric layer 419, is formed on the layer 415. A p-type InP burying layer 407 is formed on the layer 414. A p-type InGaAs contact layer 408 is formed on the layer 407.

Subsequently, channels 420 are formed to reach the underlying InP substrate 416 through the layers 408, 407, 414, and 415, forming a strip-shaped mesa structure 428, as shown in FIG. 4A. Thus, the so-called double mesa structure is formed on the substrate 2 by the mesa structures 440 and 428. For example, the pitch of the channels 420 (i.e., the width of the structure 428) is set as approximately 10 μm.

Following this, the substrate 416 having the structure of FIG. 4A is placed in an oxidation furnace, thereby selectively oxidizing the p-type InAlAs layer 414 to form the dielectric layer 419 while only the strip-shaped middle mart of the layer 414 is not oxidized, as shown in FIG. 4B. The oxidation of the layer 414 begins at its ends exposed to the channels 420, and progresses laterally toward the center of the layer 414. The unoxidized middle part of the layer 414, which extends along the mesa structure 440, serves as the current injection region through which a driving current is injected. The oxidation period is adjusted so that the remaining middle part of the layer 414 has a width of approximately 5 μm. For example, it is set as one hour.

Furthermore, a $SiO_2$ layer 413 is formed on the contact layer 408 and the inner walls of the channels 420. A window 413a, which has a shape corresponding to that of the mesa structure 440, is formed in the layer 413 to be overlapped with the remaining InAlAs layer 414 and the mesa structure 440. A p-side electrode 410 is formed on the $SiO_2$ layer 413 to be contacted with the contact layer 408 through the window 413a. An n-side electrode 411 is formed on the lower main surface of the substrate 416. Thus, the prior-art semiconductor laser 400 is fabricated, as shown in FIG. 4B.

In the prior-art semiconductor laser 400 shown in FIG. 4B, the dielectric layer 419 serves as a current-blocking layer.

With the above-explained prior-art semiconductor lasers 200, 300, and 400, the unwanted turn-on of the thyristor structure in the prior-art semiconductor laser 100 of FIG. 1 can be suppressed or eliminated. However, they have other problems described below.

With the prior-art semiconductor laser 200 shown in FIG. 2, a comparatively large current tends to flow through the recombination layer 212 along the path from the point A in the layer 107 to the point B in the substrate 101 even when the driving or injection current is low. Thus, a problem that the threshold current is unable or difficult to be lowered as desired will occur.

With the prior-art semiconductor laser 300 shown in FIG. 3B, the strip-shaped optical waveguide formed under the window 313a of the $SiO_2$ layer does not have the buried mesa structure, which is of the ridge type. Thus, effective current constriction is unable to be realized, resulting in the same problem as that identified in the prior-art semiconductor laser 200.

Moreover, because of a crystallographic reason, the dielectric layer 319 given by the oxidation of the InAlAs layer 314 is difficult to be located at a short distance of 0.1 μm or less from the MQW active layer 303. Thus, a comparatively large leakage current tends to flow through the gap between the dielectric layer 319 and the active layer 303. As a result, there arises a problem that the laser efficiency cannot be raised in the high-output operation condition, although the undesired turn-on of the thyristor structure can be prevented.

Additionally, the oxidation length of the p-type InAlAs layer 314 that determines the width of the current injection region is controlled only by changing the oxidation period of the layer 314. Thus, there arises a problem that the formation of the dielectric layer 319 through the oxidation process does not have satisfactory reproducibility and satisfactory in-plane uniformity, and that the width of the current injection region fluctuates along its axial direction to result in degradation in laser characteristics.

With the prior-art semiconductor laser 400 shown in FIG. 4B, the optical waveguide has the buried mesa structure 440 and therefore, the path for the leakage current can be limited or narrowed compared with the prior-art laser 300 shown in FIG. 3B. However, the width of the current injection region is unable to be narrowed as desired, because the formation process of the current injection region is performed by controlling the oxidation period of the InAlAs layer 414 similar to the prior-art laser 300. Accordingly, a comparatively large leakage current tends to flow, thereby causing a problem that the threshold current is unable or difficult to be decreased.

There is another problem that the formation of the dielectric layer 419 through the oxidation process does not have satisfactory reproducibility and satisfactory in-plane uniformity, similar to the prior-art laser 300.

Furthermore, as seen from FIG. 4B, the unoxidized InAlAs layer 414, the resistance of which is difficult to be lowered, exists over the active layer 403. Thus, there is a further problem that the current injection efficiency is degraded remarkably.

In summary, the prior-art semiconductor laser 100 of FIG. 1 has the problem that the unwanted turn-on of the thyristor structure tends to occur although the threshold current can be lowered. This means that the laser 100 has unsatisfactory characteristics in the high-temperature and/or high-output operation condition.

Each of the prior-art semiconductor lasers 200, 300, and 400 of FIGS. 2, 3B, and 4B can solve the unwanted turn-on problem of the prior-art semiconductor laser 100. However, it has the problem that the threshold current is unable or difficult to be lowered. In other words, none of them realizes a current-constricting structure that satisfies both the low threshold current and the satisfactory characteristics at high-temperature and/or high-output operating conditions.

SUMMARY OF THE INVENTION

Accordingly, an object of the present invention is to provide a semiconductor photonic element and a semiconductor photonic device that realize low threshold current and satisfactory characteristics in the high temperatures and/or high output operating condition, and a method of fabricating the same.

Another object of the present invention is to provide a semiconductor photonic element and a semiconductor photonic device that can be fabricated with satisfactory reproducibility and uniformity, and a method of fabricating the same.

Still another object of the present invention is to provide a semiconductor photonic element and a semiconductor photonic device that prevents the current injection efficiency from lowering, and a method of fabricating the same.

The above objects together with others not specifically mentioned will become clear to those skilled in the art from the following description.

According to a first aspect of the present invention, a semiconductor photonic element is provided, which is comprised of:

(a) a semiconductor substrate having a first surface and a second surface opposite to the first surface;

(b) a mesa structure formed on the first surface of the substrate to extend in a specific direction;
  the mesa structure including an active layer and a pair of p- and n-type cladding layers located respectively at top and bottom sides of the active layer, forming a double heterojunction;

(c) a multilayer current-constricting structure for constricting an injection current;
  the current-constricting structure being formed at each side of the mesa structure to expose a top of the mesa structure from the current-constricting structure;
  the current-constricting structure comprising a first current-blocking part and a second current-blocking part;
  the first current-blocking part having a dielectric current-blocking layer that extends to the mesa structure;
  the dielectric current-blocking layer being contacted with top edges of the mesa structure;
  the second current-blocking part having a semiconductor current-blocking layer; and (d) a semiconductor burying layer formed to cover the mesa structure and the multilayer current-constricting structure;
  the semiconductor burying layer being contacted with the top of the mesa structure.

With the semiconductor photonic element according to the first aspect of the present invention, the multilayer current-constricting structure is provided at each side of the mesa structure. Also, since the first current-blocking part of the current-constricting structure has the dielectric current-blocking layer, the leakage current can be effectively blocked, in other words, the current-constricting structure exhibits a good current-constricting function.

As a result, the threshold current of the semiconductor photonic element according to the first aspect can be effectively lowered. Also, even if the element according to the first aspect operates in a high-temperature and/or high-output condition where the leakage current becomes large, the undesired turn-on of the thyristor structure can be effectively prevented, in other words, the laser has satisfactory characteristics in the high-temperature and/or high-output operation condition.

Next, the dielectric current-blocking layer of the first current-blocking part of the current-constricting structure is formed at each side of the mesa structure so as to expose the top of the mesa structure and at the same time, the semiconductor burying layer is formed to be contacted with the top of the mesa structure. Thus, no semiconductor layer suppressing the applied injection current exists over the mesa structure.

Moreover, since the dielectric current-blocking layer of the first current-blocking part of the current-constricting structure is contacted with the top edges of the mesa structure, the width of the current injection region can be set as narrow as possible.

As a consequence, the current injection efficiency of the semiconductor photonic element according to the first aspect can be prevented from lowering.

Finally, the dielectric current-blocking layer of the first current-blocking part of the current-constricting structure is contacted with the top edges of the mesa structure. Therefore, the dielectric current-blocking layer can be formed by fully oxidizing a semiconductor layer that has been formed at each side of the mesa structure to be contacted with the top edges of the mesa structure. Thus, the semiconductor photonic element according to the first aspect can be fabricated with satisfactory reproducibility and uniformity.

In a preferred embodiment of the element according to the first aspect, the second current-blocking part has three stacked semiconductor current-blocking layers of p-, n-, and p-type or n-, p-, and n-type.

In another preferred embodiment of the element according to the first aspect, the semiconductor current-blocking layer of the second current-blocking part has a semi-insulating property, in other words, the semiconductor current-blocking layer is doped with an impurity such as Fe to raise its electric resistance.

In this embodiment, there is an additional advantage that the current blocking effect is further improved because the electric resistance of the semiconductor current-blocking layer is increased.

In still another preferred embodiment of the element according to the first aspect, the first current-blocking part of the current-constricting structure is located to be near the substrate and the second current-blocking part of the current-constricting structure is located to be apart from the substrate.

In this embodiment, there is an additional advantage that the second current-blocking part is utilized for blocking the injection current.

In a further preferred embodiment of the element according to the first aspect, a space is formed between the first surface of the substrate and the current-constricting structure. The space is filled with a semiconductor layer formed on the first surface of the substrate.

In this embodiment, there is an additional advantage that there is no possibility that the dielectric current-blocking layer of the first current-blocking part is contacted with the active layer of the mesa structure, thereby preventing the crystallographic properties of the active layer from degrading.

In a still further preferred embodiment of the element according to the first aspect, the mesa structure has a plan shape of a strip with a width of 10 μm or less. Each side face of the mesa structure corresponds to the (111) B-plane.

In this embodiment, there is an additional advantage that the thickness and composition of the active layer can be easily controlled and that the side faces of the mesa structure can be formed smooth if the mesa structure is formed by selective MOVPE. There is another additional advantage that the scattering loss can be reduced if each side face of the mesa structure corresponds to the (111) B-plane.

In a still further preferred embodiment of the element according to the first aspect, the dielectric current-blocking layer of the first current-blocking part is made of a semiconductor material containing Al. This is because Al tends to be combined with oxygen (O), i.e., Al is easily oxidized.

For example, the dielectric current-blocking layer of the first current-blocking part may be made of one selected from the group consisting of InAlAs, AlAsSb, the combination of an AlAs sublayer and an InAlAs sublayer with the superlattice structure, and the combination of an AlAs sublayer and an AlAsSb sublayer with the superlattice structure.

Since the content of Al of AlAs is greater than that of InAlAs or AlAsSb, it has a better oxidation property than that of InAlAs or AlAsSb. On the other hand, InAlAs or AlAsSb has a good lattice matching property with a semiconductor substrate, especially, an InP substrate. Thus, each of the combination of an AlAs sublayer and an InAlAs sublayer with the superlattice structure and the combination of an AlAs sublayer and an AlAsSb sublayer with the superlattice structure has both a good oxidation property and a good lattice matching property with a semiconductor substrate. As a result, there is an additional advantage that the oxidation can be well performed (i.e., the dielectric current-blocking layer of the first current-blocking part can be well formed) while the crystallographic property of the other layers is kept unchanged if these superlattice structures are oxidized.

Similarly, if an InAlAs or AlAsSb layer is oxidized, there is the same additional advantage as above.

In a still further preferred embodiment of the element according to the first aspect, the dielectric current-blocking layer of the first current-blocking part is sandwiched by a pair of InGaAsP layers or by a pair of InGaAs layers.

In this embodiment, there is an additional advantage that the dielectric current-blocking layer of the first current-blocking part can be well formed, in other words, a good crystallographic property of the dielectric layer is obtained.

In a still further preferred embodiment of the element according to the first aspect, the dielectric current-blocking layer of the first current-blocking part has a thickness of 10 to 100 nm.

If the dielectric current-blocking layer has a thickness less than 10 nm, the electrical insulating property is not sufficient. If the dielectric current-blocking layer has a thickness greater than 100 nm, the crystallographic property of the other layers tends to degrade.

According to a second aspect of the present invention, a method of fabricating the semiconductor photonic element according to the first aspect is provided.

This method comprises the steps of:
(a) A semiconductor substrate having a first surface and a second surface opposite to the first surface is prepared.
(b) A mesa structure is formed on the first surface of the substrate to extend in a specific direction by a selective growth method.

The mesa structure includes an active layer and a pair of p- and n-type cladding layers located respectively at top and bottom sides of the active layer, forming a double heterojunction.

(c) A masking dielectric layer is selectively formed on a top of the mesa structure.
(d) A set of semiconductor layers are selectively and successively formed at each side of the mesa structure to expose the top of the mesa structure from the current-constricting structure using the masking dielectric layer.

The set of semiconductor layers are used for forming a multilayer current-constricting structure for constricting an injection current.

The set of semiconductor layers includes a semiconductor layer to be oxidized.

(e) The masking dielectric layer is removed from the top of the mesa structure after the step (d).
(f) A semiconductor burying layer is formed to cover the mesa structure and the set of semiconductor layers.

The semiconductor burying layer being contacted with the top of the mesa structure.

(g) A pair of channels are formed at each side of the mesa structure by etching to penetrate the burying layer and the set of semiconductor layers.
(h) The semiconductor layer to be oxidized in the set of semiconductor layers is selectively oxidized to form a dielectric current-blocking layer that extends to the mesa structure and that is contacted with top edges of the mesa structure, resulting in the current-constricting structure.

The current-constricting structure comprises a first current-blocking part and a second current-blocking part. The first current-blocking part has the dielectric current-blocking layer. The second current-blocking part has the semiconductor layer or layers other than the dielectric current-blocking layer.

With the semiconductor photonic element according to the first aspect of the present invention, since the current-constricting structure is selectively located at each side of the mesa structure while the dielectric current-blocking layer is contacted with the top edges of the mesa structure, the oxidation process of the semiconductor layer to be oxidized in the set of the semiconductor layers automatically ends at the top edges of the mesa structure. Thus, if, for example, the oxidation period is set to be excessive slightly, the dielectric current-blocking layer can be formed to have a uniform quality in its whole length. As a result, the semiconductor photonic element according to the first aspect can be fabricated with satisfactory reproducibility and uniformity.

According to a third aspect of the present invention, a semiconductor photonic device is provided, which comprises the semiconductor photonic element according to the first aspect and another photonic element such as an optical modulator, an optical waveguide, an optical switch, and an optical amplifier formed on the substrate.

With the semiconductor photonic device according to the third aspect of the present invention, there are the same advantages as those of the semiconductor photonic element according to the first aspect.

BRIEF DESCRIPTION OF THE DRAWINGS

In order that the present invention may be readily carried into effect, it will now be described with reference to the accompanying drawings.

FIG. 7 is a graph showing the oxidation temperature dependence of the oxidation rate of the InAlAs layer used in the semiconductor laser according to the first embodiment of FIG. 5.

DETAILED DESCRIPTION OF THE PREFERRED EMBODIMENTS

Figure 1:
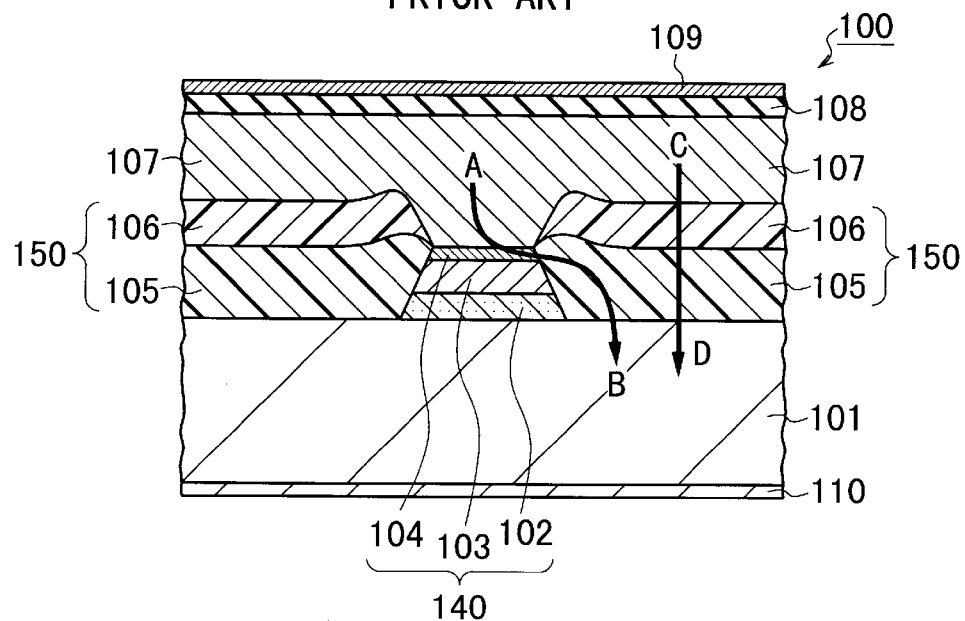
FIG. 1 is a partial cross-sectional view of a prior-art semiconductor laser, in which a conventional current-constricting structure is used.
Figure 2:
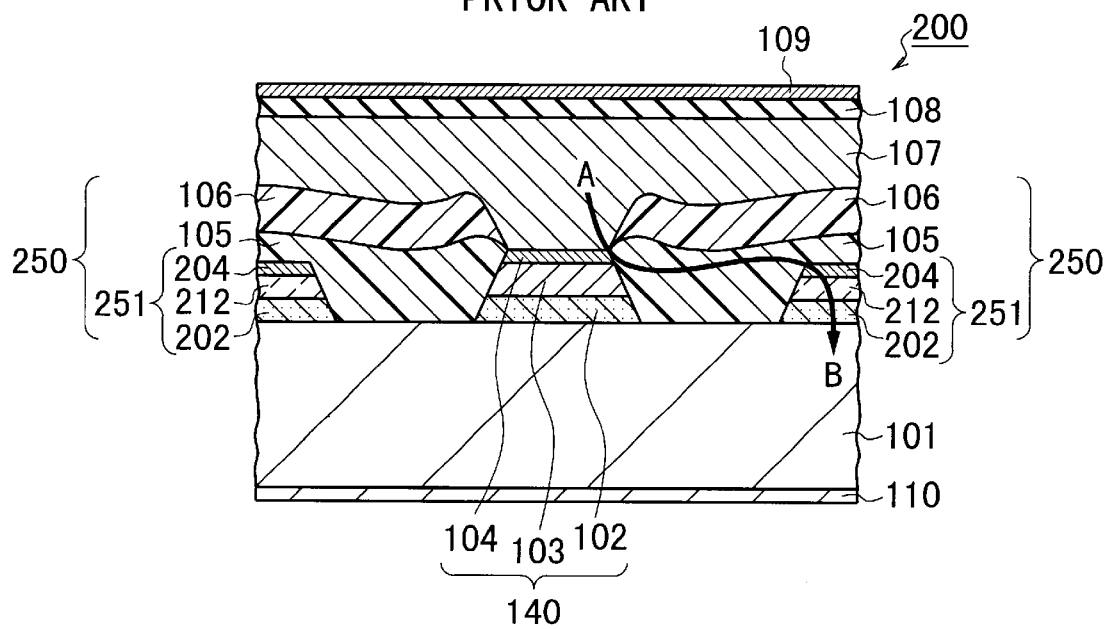
FIG. 2 is a partial cross-sectional view of a prior-art semiconductor laser using an improved current-constricting structure for suppressing the undesired turn-on problem.

Preferred embodiments of the present invention will be described in detail below while referring to the drawings attached.

FIRST EMBODIMENT

Figure 5:
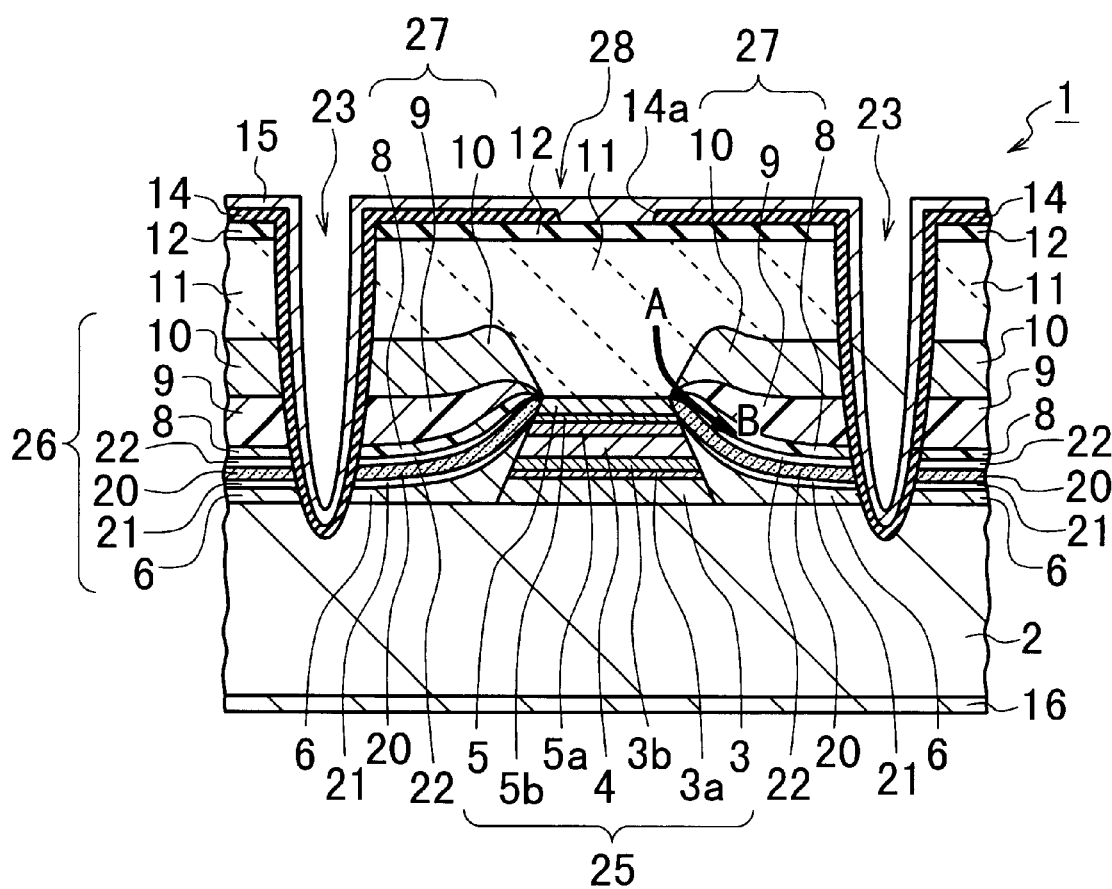
FIG. 5 is a partial cross-sectional view of a semiconductor laser according to a first embodiment of the invention.

FIG. 5 shows the configuration of a semiconductor laser according to a first embodiment.

As shown in FIG. 5, the semiconductor laser 1 according to the first embodiment is comprised of an n-type InP substrate 2, a strip-shaped mesa structure 25 formed on an upper surface of the substrate 2, and a multilayer current-constricting structure 26 selectively formed on the surface of the substrate 2 at each side of the mesa structure 25. An optical waveguide forming the resonator of the laser is formed in the mesa structure 25 to extend along its axial direction.

The mesa structure 25 is formed by a p-type InP cladding layer 3 formed on the surface of the InP substrate 2, an n-type InGaAs guiding layer 3a formed on the layer 3, an n-type InGaAs guiding layer 3b formed on the layer 3a, an InGaAsP MQW active layer 4 formed on the layer 3b, a p-type InGaAs guiding layer 5a formed on the layer 4, a p-type InGaAs layer 5b formed on the layer 5a, and a p-type InP cladding layer 5 formed on the layer 5b. The active layer 4 is formed by undoped InGaAsP barrier sublayers (not shown) and undoped InGaAsP well sublayers (not shown) that are alternately stacked on each other. Since the InGaAsP active layer 4 is sandwiched by the n-type InGaAs guiding layer 3b and the p-type InGaAs guiding layer 5a, the mesa structure 25 has a double heterojunction.

The multilayer current-constricting structure 26 is formed by a p-type InP separation layer 6 formed on the surface of the substrate 2 at each side of the mesa structure 25, an undoped InGaAs buffer layer 21 formed on the layer 6, an dielectric layer 20 formed on the layer 21, an undoped InGaAs buffer layer 22 formed on the layer 20, a p-type InP current-blocking layer 8 formed on the layer 22, an n-type InP current-blocking layer 9 formed on the layer 8, and a p-type InP current-blocking layer 10 formed on the layer 9. The dielectric layer 20 serves as a first part of the structure 26. The combination of the p-type InP current-blocking layer 8, the n-type InP current-blocking layer 9, and the p-type InP current-blocking layer 10 serves as a second part of the structure 26. Thus, the structure 26 and the n-type InP substrate 2 constitute a so-called pnpn thyristor structure except that the dielectric layer 20 is included therein.

A p-type InP burying layer 11 is formed to cover the mesa structure 25 and the current-constricting structure 26, thereby burying the structures 25 and 26. A $p^+$-type InGaAs contact layer 12 is formed on the layer 11.

A pair of channels 23 are formed at each side of the mesa structure 25 to be symmetrical with respect thereto. The channels 23 are formed to vertically penetrate through the contact and burying layers 12 and 11 and the underlying structure 25, reaching is the inside of the underlying substrate 2.

A $SiO_2$ layer 14 having a strip-shaped window 14a is formed on the $p^+$-type InGaAs contact layer 12 to be contacted with the inner walls of the channels 23. The window 14a is located to be overlapped with the mesa structure 25, exposing selectively the contact layer 12 from the layer 14. The window 14a allows a current to vertically flow through only the parts of the layers 11 and 12 just over the active layer 4.

A p-side electrode 15 is formed on the $SiO_2$ layer 14 to cover the window 14a. Thus, the electrode 15 is contacted with the underlying contact layer 12 through the window 14a.

An n-side electrode 16 is formed on a lower surface of the substrate 2. A driving or injection current flows vertically from the p-side electrode 15 to the n-side electrode 16 to penetrate through the inside of the laser 1.

With the semiconductor laser 1 according to the first embodiment of FIG. 5, the current-constricting structure 26 includes the dielectric layer 20 as its first part and the semiconductor current-blocking layers 8, 9, and 10 as its second part 27 arranged vertically in series. Therefore, the unwanted turn-on of the pnpn thyristor structure formed in the structure 26 can be prevented from occurring and at the same time, the threshold current can be lowered. In other words, the current-constricting structure 26 produces an effective current-constricting performance.

Therefore, when the injection current is small, almost all the injected current flows through the mesa structure 25 including the active layer 4 due to the existence of the second part 27 of the current-constricting structure 26 (i.e., the semiconductor layers 8, 9, and 10). In this case, substantially no leakage current flows through the structure 26.

On the other hand, when the injection current is large for making high output, a leakage current tends to flow along the path from the point A to the point B in FIG. 5. In this case, however, even if a leakage current flows along the path from the point A to the point B, it does not serve as the gate current of the thyristor structure due to the existence of the first part (i.e., the dielectric layer 20) of the current-constricting structure 26. Therefore, a large anode current of the thyristor structure does not flow to penetrate vertically the structure 26, which means that the structure 26 never cause the unwanted turn-on and that it operates normally. This is also realized when the injection current is applied at a high temperature.

Figure 6A:
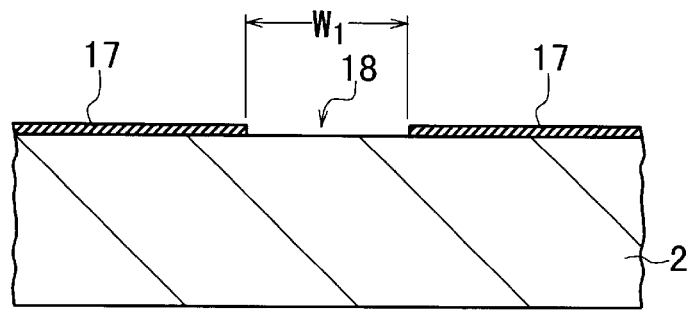
FIGS. 6A to 6E are partial cross-sectional views showing the fabrication method of the semiconductor laser according to the first embodiment of FIG. 5, respectively.

Next, a method of fabricating the semiconductor laser 1 according to the first embodiment is explained below with reference to FIGS. 6A to 6E. .First, as shown in FIG. 6A, a $SiO_2$ layer 17 with a thickness of 100 nm is formed on the upper surface of the n-type InP substrate 2 by using the thermal CVD technique. Here, the upper surface of the substrate 2 correspond to the (001)-plane. Then, by using the photography and wet chemical etching techniques, the $SiO_2$ layer 17 is patterned to have a strip-shaped window 18. The width $W_1$ of the window 18 is, for example, set as 2 μm. The layer 17 thus patterned serves as a mask for subsequent selective MOVPE processes. For example, the mask 17 has a pair of strips extending parallel to the [001]-orientation of the substrate 2, where each of the strips has a width of 50 μm and the pair of strips are apart from each other at a distance of 1.5 m.

Figure 6B:
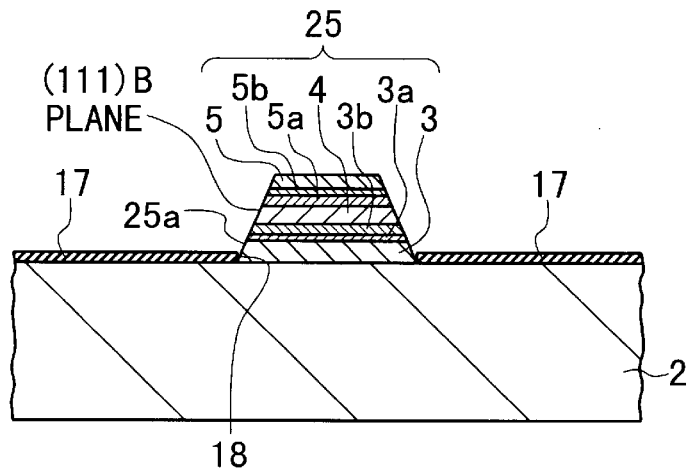

Subsequently, as shown in FIG. 6B, the p-type InP cladding layer 3 is selectively grown by MOVPE on the exposed surface of the substrate 2 from the mask 17. The layer 3 has a carrier concentration of $1 \times 10^{18}$ atoms/$cm^3$ and a thickness of 100 nm. The n-type InGaAs guiding layer 3a is selectively grown by MOVPE on the layer 3, where the layer 3a has a carrier concentration of $1 \times 10^{18}$ atoms/$cm^3$, a bandgap wavelength of 1.05 μm, and a thickness of 20 nm. The n-type InGaAs guiding layer 3b is selectively grown by MOVPE on the layer 3a, where the layer 3b has a carrier it concentration of $1 \times 10^{18}$ atoms/$cm^3$, a bandgap wavelength of 1.13 μm, and a thickness of 50 nm.

Furthermore, the undoped InGaAsP barrier sublayers and the undoped InGaAsP well sublayers are successively and selectively grown by MOVPE to be alternately stacked to each other, thereby forming the MQW active layer 4 on the layer 3b. The layer 4 has an optical emission wavelength of 1.3 μm and a thickness of 90 nm.

On the active layer 4 thus formed, the p-type InGaAs guiding layer 5a is selectively grown by MOVPE, where the layer 5a has a carrier concentration of $1 \times 10^{18}$ atoms/$cm^3$, a bandgap wavelength of 1.05 μm, and a thickness of 50 nm. The p-type InGaAs guiding layer 5b is selectively grown by MOVPE on the layer 5a, where the layer 5b has a carrier concentration of $1 \times 10^{18}$ atoms/$cm^3$, a bandgap wavelength of 1.13 μm, and a thickness of 20 nm. The p-type InP cladding layer 5 is selectively grown by MOVPE on the layer 5b, where the layer 5 has a carrier concentration of $5 \times 10^{17}$ atoms/$cm^3$ and a thickness of 70 nm.

Thus, the mesa structure 25 is formed on the upper surface of the substrate 2 through a series of the selective MOVPE processes, as shown in FIG. 6B. Due to the orientation dependence of the growth rate of the semiconductor layers 3, 3a, 3b, 4, 5a, 5b, and 5, each side face 25a of the structure 25 forms the uniform, smooth (111) B-plane. Accordingly, the structure 25 produces an optical waveguide for laser oscillation that have extremely low scattering loss. Since the mesa structure 25 is formed by the MOVPE processes without using the wet or dry etching technique, there is an advantage that the surfaces 25a of the structure 25 have no unevenness along its axial direction.

Figure 6C:
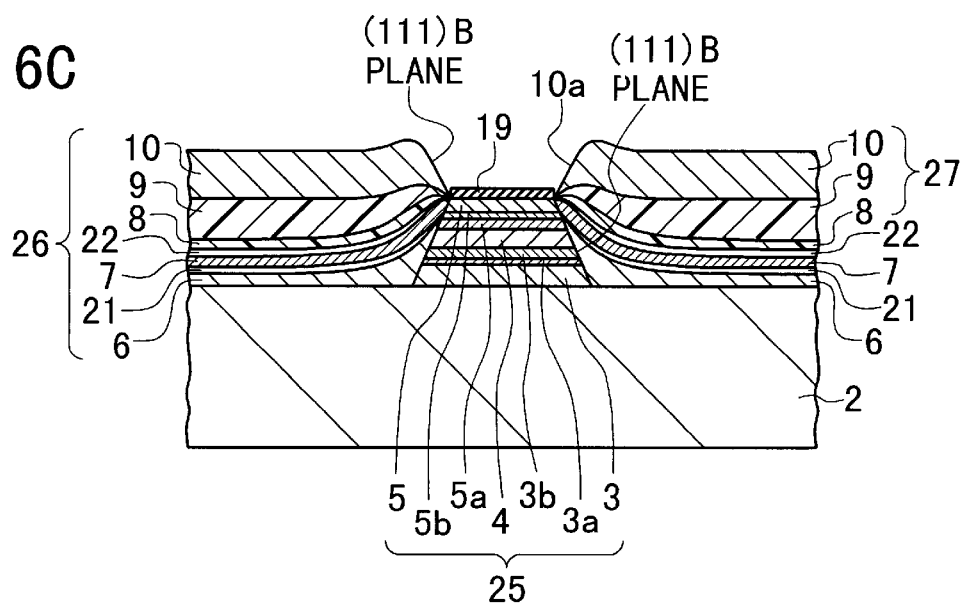
Figure 6D:
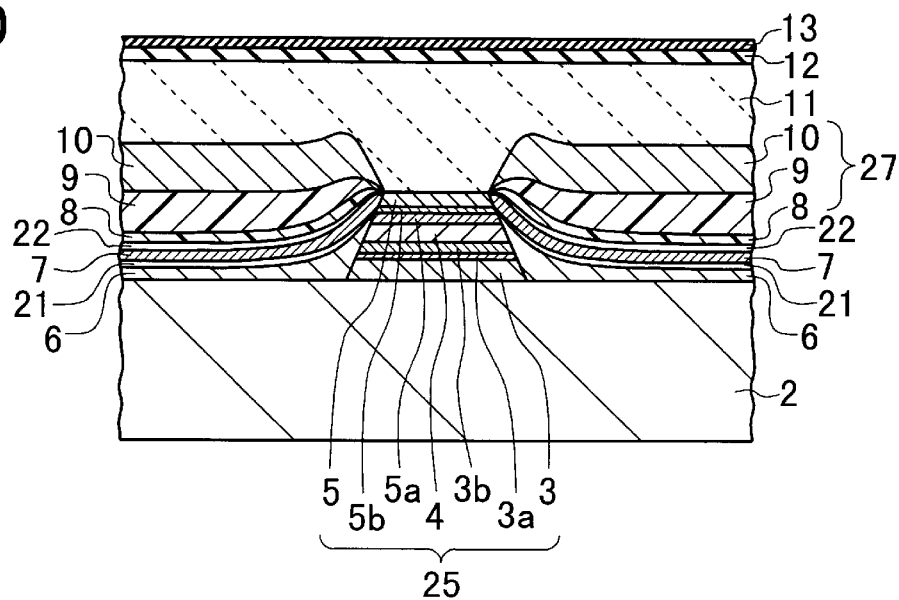

After the $SiO_2$ mask 17 is removed from the substrate 2, an $SiO_2$ layer (not shown) is formed on the whole surface of the substrate 2 to cover the mesa structure 25. The $SiO_2$ layer thus formed is then patterned to be left only on the top of the mesa structure 25, thereby forming the $SiO_2$ layer 19, as shown in FIG. 6C. The layer 19 is used as a mask for suppressing the growth on the structure 25 in the subsequent selective MOVPE processes.

Following this, the multilayer current-constricting structure 26 is formed by a series of selective MOVPE processes. Specifically, first, the p-type InP separation layer 6 with a thickness of 50 nm is selectively grown on the exposed surface of the substrate 2 at each side of the mesa structure 25. Next, the undoped InGaAs buffer layer 21 with a thickness of 5 nm is selectively grown on the layer 6. An InAlAs layer 7 with a thickness of 8 nm is selectively grown on the layer 21 for forming the dielectric layer 20 in the later process. The undoped InGaAs buffer layer 22 with a thickness of 5 nm is selectively grown on the layer 7. The p-type InP current-blocking layer 8 with a thickness of 500 nm is selectively grown on the layer 22. The n-type InP current-blocking layer 9 with a thickness of 500 nm is selectively grown on the layer 8. The p-type InP current-blocking layer 10 with a thickness of 500 nm is selectively grown on the layer 9. Thus, the multilayer current-constricting structure 26 is completed. The state at this stage is shown in FIG. 6C.

As shown in FIG. 6C, due to the mesa structure 25, each of the opposing side faces 10a of the p-type InP current-blocking layer 10 forms the uniform, smooth (111) B-plane.

Thereafter, the $SiO_2$ layer 19 on the top of the mesa structure 25 is removed. Then, the p-type InP burying layer 11 is grown by MOVPE on the mesa and current-constricting structures 25 and 26 over the whole substrate 2, where the layer 11 has a carrier concentration of $5 \times 10^{17}$ atoms/$cm^3$ and a thickness of 1.5 μm. The p+-type InGaAs contact layer 12 with a thickness of 300 nm is grown by MOVPE on the layer 11. The $SiO_2$ layer 13 is formed on the layer 12 and patterned to have windows 13a for forming the pair of channels 23. The patterned $SiO_2$ layer 13 serves as a mask in the later etching process of forming the channels 23. The mesa structure 28 has a width $W_2$ of 8 μm.

Figure 6E:
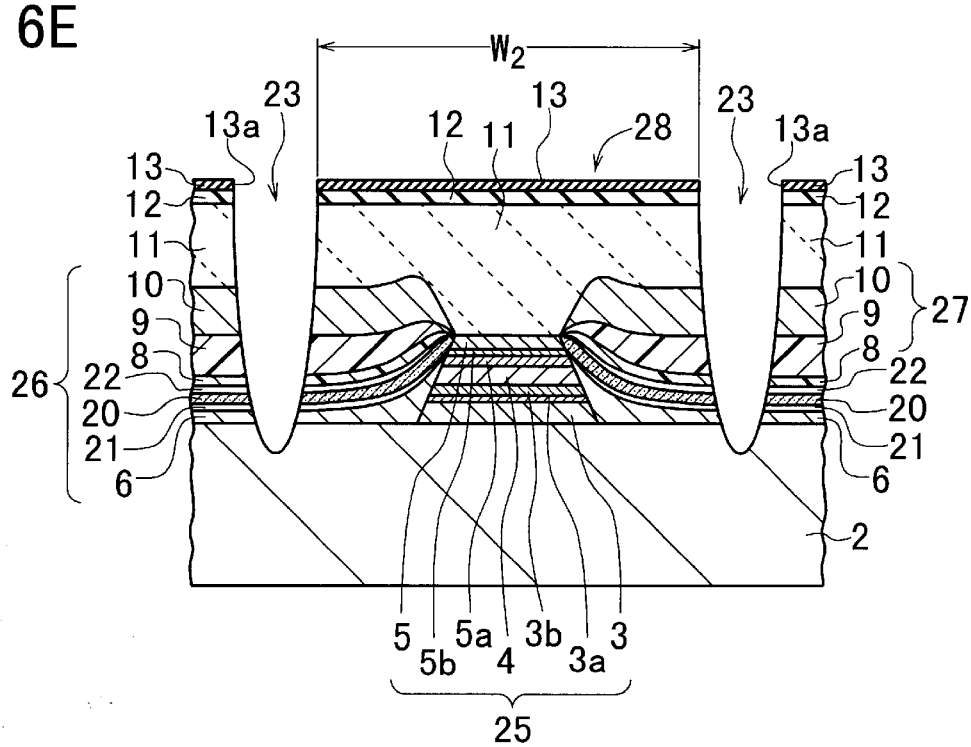

Using the patterned $SiO_2$ layer 13 as a mask, the underlying layers 12, 11, 10, 9, 8, 22, 7, 21, and 6 and the substrate 2 are selectively etched to form the pair of channels 23, as shown in FIG. 6E. Thus, a mesa structure 28 is formed on the substrate 2 between the channels 23, which includes the mesa structure 25. As a result, the so-called double mesa structure is formed by the mesa structures 25 and 28 on the surface of the substrate 2.

The substrate 2 having the double mesa structure is placed in an oxidation furnace for four hours, thereby oxidizing selectively the InAlAs layer 7 in the current-constricting structure 26. The oxidation of the InAlAs layer 7 progresses laterally from its exposed outer edges in the channels 23 to its inner edges connected to the mesa structure 25. For example, when the oxidation temperature is set as 470° C. and the thickness of the InAlAs layer 7 is 80 nm, the oxidation rate is approximately 1 μm/hour, and the oxidized region reaches the inner edges of the layer 7 that are contacted with the mesa structure 25. The growth of the oxidized region is automatically finished at the inner edges of the layer 7, thereby forming the dielectric layer 20. As a result, the layer 20 can be formed to have sufficient in-plane uniformity at good reproducibility.

After the remaining $SiO_2$ layer 13 is removed from the contact layer 12, the $SiO_2$ layer 14 is grown on the contact layer 12 over the substrate 2, as shown in FIG. 5. The layer 14 covers not only the surface of the layer 12 but the inner walls of the channels 23. The layer 13 is then patterned to have the strip-shaped window 14a just over the strip-shaped mesa structure 25, thereby narrowing the current path running toward the active layer 4 in the structure 25.

Finally, the p-side electrode 15 is formed on the $SiO_2$ layer 14. The electrode 15 is contacted with the contact layer 12 through the window 14a. The n-side electrode 16 is formed on the lower surface of the substrate 2. The electrode 16 covers the whole lower surface of the substrate 2. Thus, the semiconductor laser 1 having the configuration shown in FIG. 5 is fabricated.

FIG. 7 shows the oxidation temperature dependence of the oxidation rate of the InAlAs layer 7. As seen from FIG. 7, the layer 7 can be fully oxidized by placing the layer 7 in the furnace for approximately four hours or longer.

With the method of fabricating the laser 1 according to the first embodiment, as explained above, the dielectric layer 20 can be formed in the current-constricting structure 26, so that the layer 20 is located to be serially connected to the semiconductor current-blocking layers 8, 9, and 10 in the structure 26. Thus, the threshold current of the laser 1 can be effectively lowered.

The inventors' test gave the following results about the semiconductor laser 1 according to the first embodiment.

The length of the resonator (i.e., the waveguide formed in the mesa structure 25) of the laser 1 was set as 150 μm. High-reflectance coating with the 70% reflectance was applied to the front end of the resonator and that with the 95% reflectance was applied to the rear end thereof. In this case, the oscillation wavelength was 1.3 μm, the threshold current was 500 μA, and the slope efficiency was 0.65 W/A, showing that the laser 1 had excellent characteristics.

On the other hand, the length of the resonator of the laser 1 was set as 600 μm. Low-reflectance coating with the 5% reflectance was applied to the front end of the resonator and high-reflectance coating with the 95% reflectance was applied to the rear end thereof. In this case, the maximum optical output of 400 mW was realized by injecting continuously the driving current at 25° C.

Since the $SiO_2$ layer 19 was formed on the p-type InP cladding layer 5 of the mesa structure 25, as shown in FIG. 6C, the semiconductor layers 6, 21, 7, 22, 8, 9, and 10 constituting the current-constricting structure 26 exhibited no abnormal growth on the substrate 2 at each side of the mesa structure 25 in their selective MOVPE processes, in other words, no semiconductor layer that overhangs the $SiO_2$ layer 19 was observed. Thus, uniform, smooth (111) B-planes were formed on the opposing side faces 10a of the p-InP current-blocking layer 10, which was found very effective in the formation process of the thick multilayer current-constricting structure 26 by selective MOVPE.

Although the selective growth of the InAlAs layer 7 has been very difficult, it was able to be realized in the fabrication method according to the first embodiment if the growth conditions such as the growth temperature and the growth rate were optimized. For example, the growth temperature was set as 650° C. and the growth rate was set as 10 nm/sec. Thus, it was confirmed that the multilayer current-constricting structure 26 was able to be formed by a series of the selective MOVPE processes.

If the dielectric layer 20 is contacted with the MQW active layer 4, there is a possibility that the crystallographic property of the active layer 4 deteriorates. In the fabrication method according to the first embodiment, however, such the deterioration did not observed, because the InP layer 6 was able to be formed by MOVPE between the mesa structure 25 and the dielectric layer 20 with good controllability.

In the fabrication method according to the first embodiment, the oxidation process of the InAlAs layer 7 automatically ended at the inner ends of the layer 7 near the active layer 4 if the oxidation period was set to be excessive. As a result, the dielectric layer 20 was made uniform along the axial direction of the waveguide (i.e., the mesa structure 25). It was confirmed that this fact leaded to the good reproducibility of the current-blocking layers 8, 9, and 10 and the uniform performance of the element 1. According to the uniformity of the mesa structure 25 or the active layer 4 along its axial direction, it was confirmed that the current injection region was uniform along its axial direction.

Figure 4A:
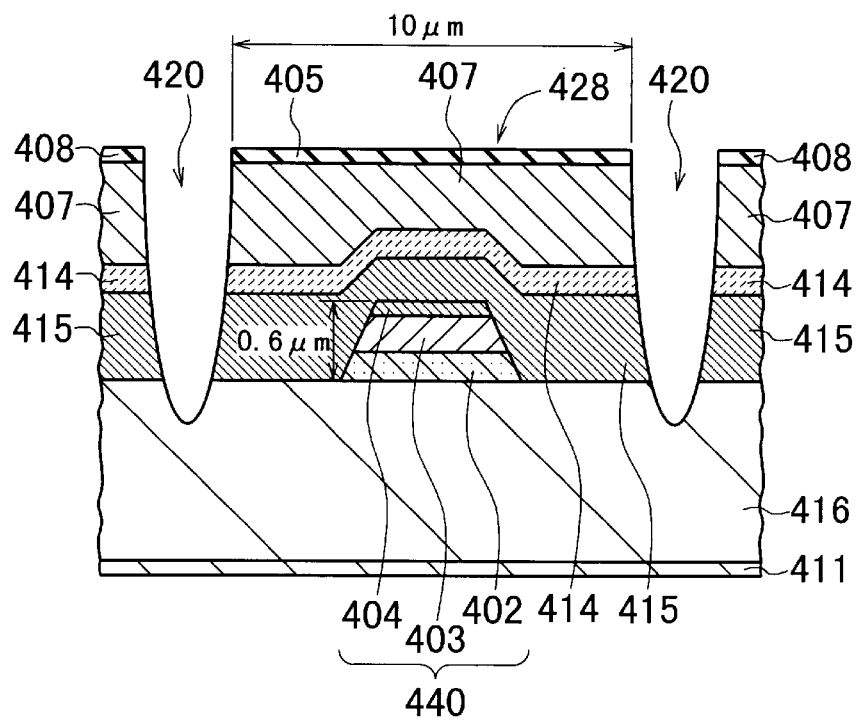
FIGS. 4A and 4B show partial cross-sections showing the fabrication method of a prior-art semiconductor laser 400, respectively, which has an improved current-constricting structure.
Figure 4B:
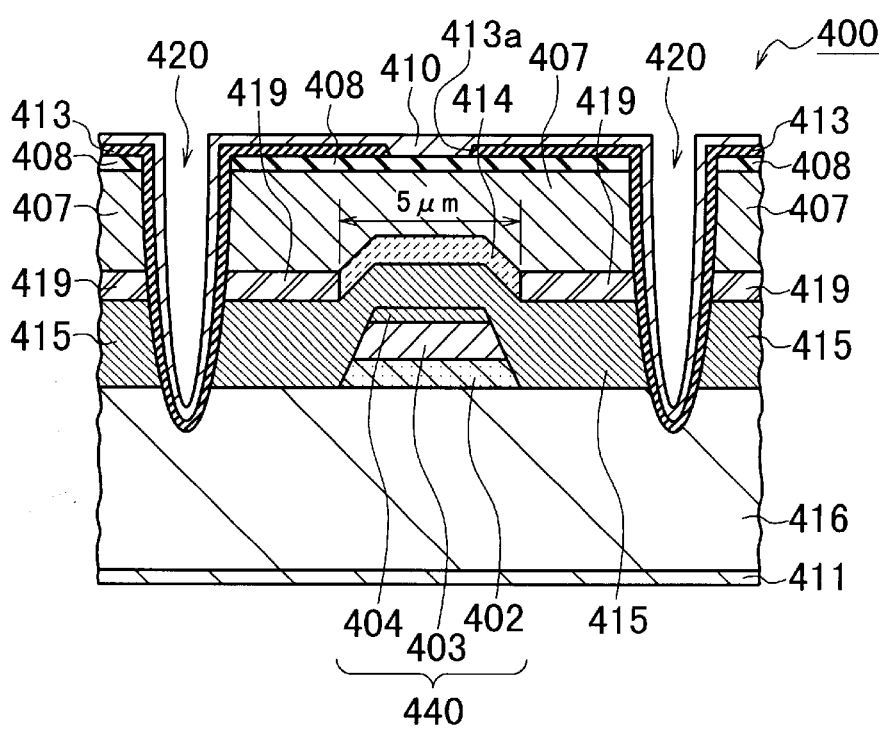

Unlike the prior-art photonic element 400 shown in FIG. 4B, the InAlAs layer 7 to be oxidized was not left to be overlapped with the mesa structure 25 in the method according to the first embodiment. Thus, it was confirmed that the current injection efficiency was able to be prevented from lowering.

Figure 3A:
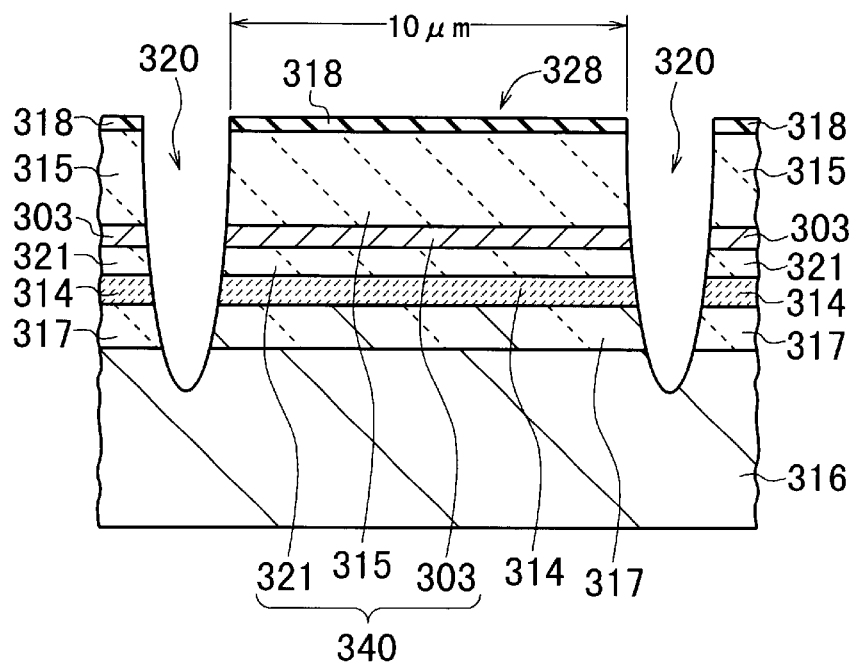
FIGS. 3A and 3B are partial cross-sectional views showing the fabrication method of a prior-art semiconductor laser, respectively, which has an improved current-constricting structure.
Figure 3B:
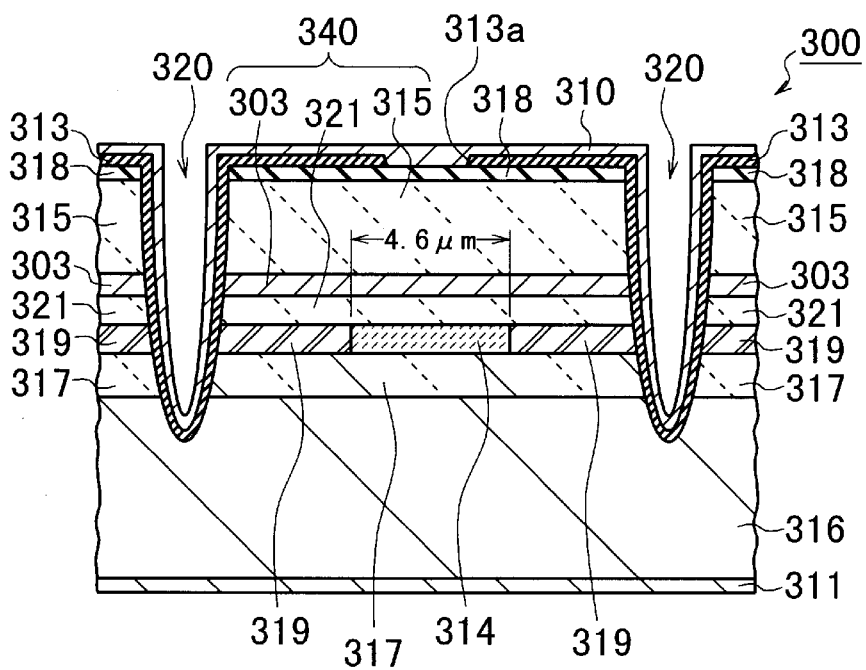

In the prior-art photonic elements 300 and 400 shown in FIGS. 3B and 4B, it is impossible to arrange other current-blocking layer or layers with different properties from each other in series with respect to the current-blocking dielectric layer 319 or 419. However, it was confirmed that this configuration was able to be realized by the semiconductor laser 1 and its fabrication method according to the first embodiment.

SECOND EMBODIMENT

Figure 8A:
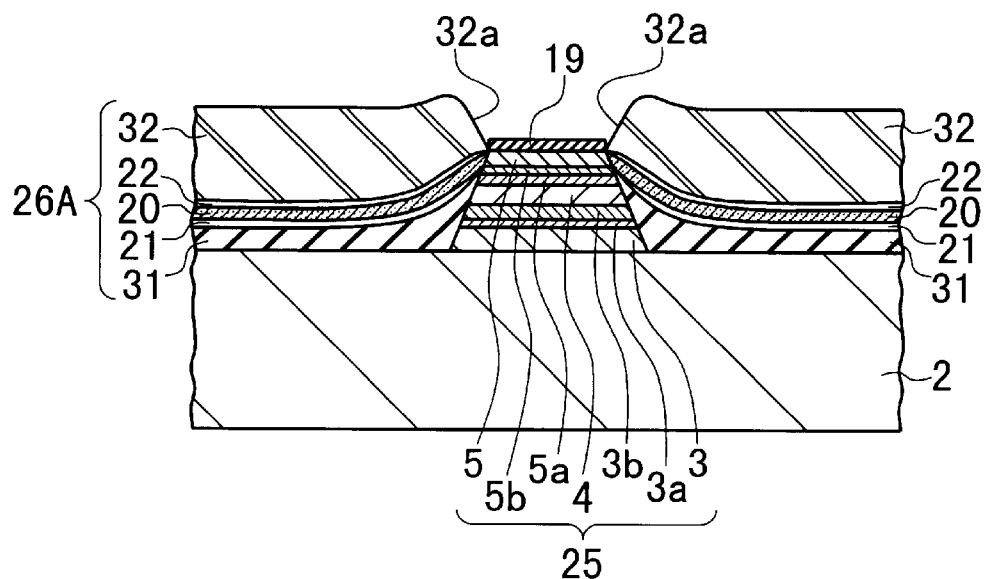
FIGS. 8A and 8B are partial cross-sectional views showing the fabrication method of a semiconductor laser according to a second embodiment of the invention, respectively.
Figure 8B:
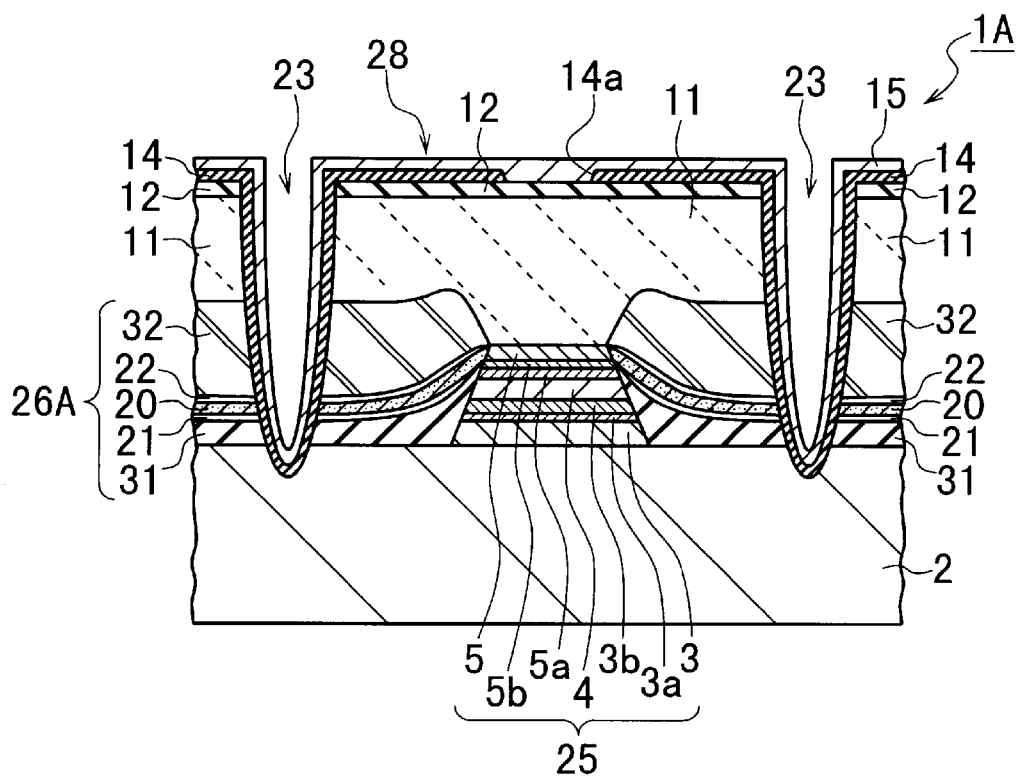

FIG. 8B shows the configuration of a semiconductor laser 1A according to a second embodiment, which has the same configuration as that of the laser 1 according to the first embodiment of FIG. 5, except that a high-resistance semiconductor layer 31 is used instead of the p-type InP separation layer 6 and that another high-resistance semiconductor layer 32 is used instead of the combination of the three InP current-blocking layers 8, 9, and 10. Therefore, the explanation about the same configuration is omitted here for simplification of description by attaching the same reference symbols as those used in the first embodiment in FIG. 5.

Each of the high-resistance semiconductor layers 31 and 32 is an InP layer doped with Fe, where Fe is introduced into the layer 31 or 32 to increase the electric resistance. Thus, the layers 31 and 32 have a so-called semi-insulating property. Since the layers 31 and 32 have a level or levels for trapping electrons, they exhibit higher resistance than that of layers that are not doped with Fe.

It is needless to say that the semiconductor laser 1A according to the second embodiment has the same advantages as those of the laser 1 according to the first embodiment. The laser 1A has an additional advantage that the current-constricting property of the current-constricting structure 26 is enhanced due to the higher resistance of the InP layers 31 and 32.

The semiconductor laser 1A according to the second embodiment is fabricated in the following way.

The process step of forming the mesa structure 25 on the upper surface of the n-type InP substrate 2 to that of selectively forming the $SiO_2$ layer 19 on the top of the structure 25 are the same as those in the fabrication method according to the first embodiment.

After the patterning process of the $SiO_2$ layer 19 used as a mask for the subsequent selective growth processes, the Fe-doped InP layer 31 with a thickness of 50 nm is selectively grown by MOVPE on the surface of the substrate 2 at each side of the mesa structure 25, as shown in FIG. 8B. Next, the undoped InGaAs buffer layer 21 with a thickness of 5 nm is selectively grown by MOVPE on the layer 6. The InAlAs layer 7 with a thickness of 80 nm for forming the dielectric layer 20 is selectively grown by MOVPE on the layer 21. The undoped InGaAs buffer layer 22 with a thickness of 5 nm is selectively grown by MOVPE on the layer 7. The Fe-doped InP current-blocking layer 32 with a thickness of 1.2 µm is selectively grown by MOVPE on the layer 22. Thus, the multilayer current-constricting structure 26A is completed. The state at this stage is shown in FIG. 8A.

As seen from FIG. BA, each of the opposing side faces 32a of the Fe-doped InP current-blocking layer 32, which are located in the vicinity of the $SiO_2$ layer 19, correspond to the uniform, smooth (111) B-planes.

The subsequent process step of removing the $SiO_2$ layer 19 from the top of the mesa structure 25 to that of forming the n-side electrode 16 on the lower surface of the substrate 2 are the same as those in the method according to the first embodiment. Thus, the semiconductor laser 1A according to the second embodiment that have the configuration shown in FIG. 8B is fabricated.

The inventors' test gave the following results.

The length of the resonator (i.e., the waveguide formed by the mesa structure 25) of the laser 1A was set as 150 µm. High-reflectance coating with the 80% reflectance was applied to the front end of the resonator and that with the 95% reflectance was applied to the rear end thereof. In this case, the oscillation wavelength was 1.3 µm, the threshold current was 0.3 mA, and the slope efficiency was 0.55 W/A. The obtainable modulation frequency was as high as 30 GHz.

Using the above-explained method, similar to the method of the first embodiment, it was confirmed that the laser 1A was able to be fabricated at a high fabrication yield.

THIRD EMBODIMENT

Figure 9:
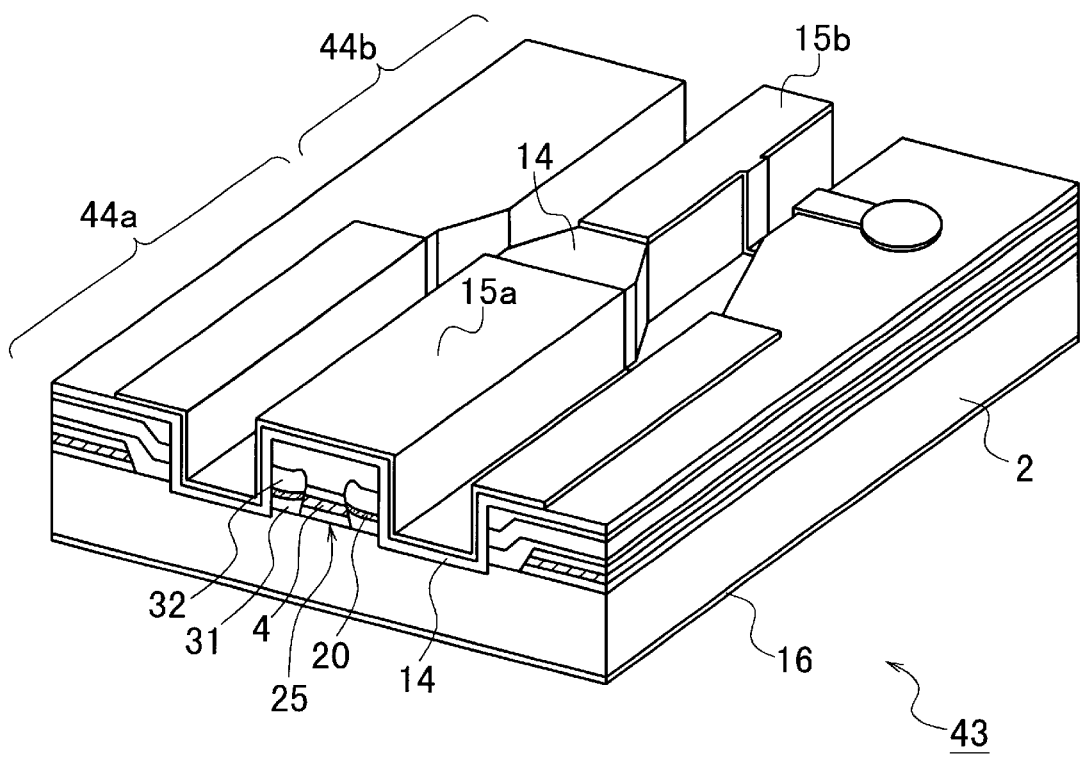
FIG. 9 is a perspective view of a semiconductor photonic device according to a third embodiment of the invention, which is comprised of a Distributed-Feedback laser and an optical modulator.

FIG. 9 shows the configuration of a semiconductor photonic device 43, which is comprised of a Distributed-Feedback (DFB) laser 44a and an optical modulator 44b of the electric-field modulation type formed on the same n-type InP substrate 2. The DFB laser 44a has the same configuration as that of the semiconductor laser 1A according to the second embodiment of FIG. 8B and a diffraction grating 45 formed below the mesa structure 25. The mesa structure 25 including the active layer 4 is commonly used by the laser 44a and the modulator 44b, where the bandgap wavelength of the active layer 4 is changed in value between the laser 44a and the modulator 44b.

The reference numerals 15a and 15b denote the p-side electrodes of the DFB laser 44a and the optical modulator 44b, respectively. The n-side electrode 16 is commonly used by the laser 44a and the modulator 44b.

The semiconductor photonic device 43 having the above-described configuration according to the third embodiment is fabricated in the following way.

Figure 10A:
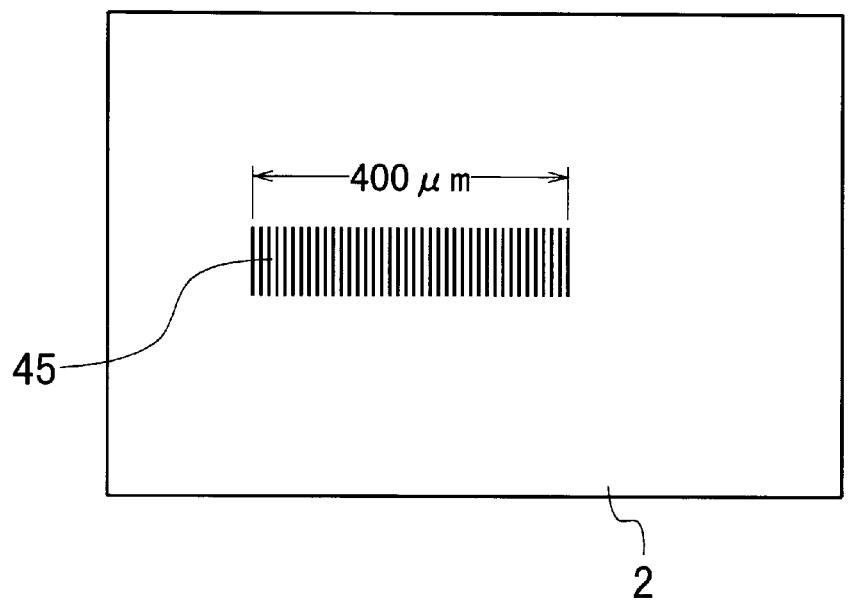
FIGS. 10A and 10B are partial plan views showing the fabrication method of the semiconductor photonic device according to the third embodiment of FIG. 9, respectively.

First, as shown in FIG. 10A, the diffraction grating 45 is formed in the area of the upper surface of the n-type InP substrate 2 for the DFB semiconductor laser 44a by a known method such as the interference or electron-beam exposure. Here, the length of the grating 45 is set as 400 µm and the width of which is set to be larger than that of the mesa structure 25.

Figure 10B:
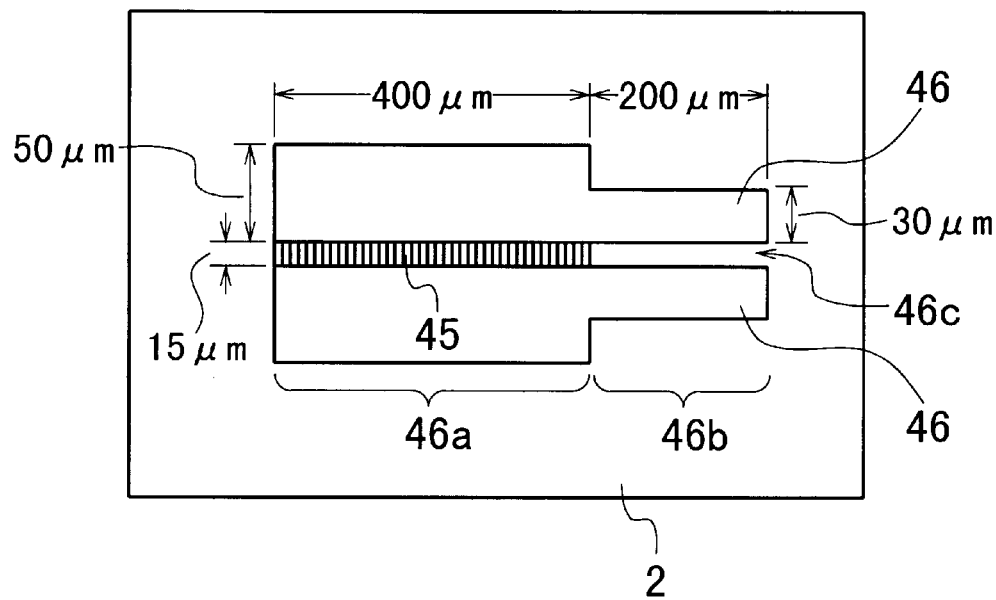

Next, as shown in FIG. 10B, a $SiO_2$ layer is formed on the upper surface of the substrate 2 to cover the grating 45 and then, it is patterned to have a plan shape shown in FIG. 10B, thereby forming a mask 46. The mask 46 is used for selective MOVPE of the mesa structure 25 including the active layer 4. The mask 46 has a rectangular part 46a for the semiconductor laser 44a, a rectangular part 46a for the modulator 46b, and a strip-shaped opening 46c extending from the outer end of the part 46a to the opposite outer end of the part 46b. The opening 46c, which is located at the middle position of the mask 46, extends in parallel to and overlapped with the underlying grating 45.

The part 46a has a length of 400 µm and a width of 115 µm. The part 46b has a length of 200 µm and a width of 75 µm. The opening 46c has a length of 600 µm and a width of 15 µm. Thus, the part 46a has two rectangular areas of 400 µm×50 µm arranged at each side of the opening 46c, and the part 46b has two rectangular areas of 200 µm×30 µm arranged at each side of the opening 46c.

Using the mask 46, the mesa structure 25 is formed by selective MOVPE processes in the following way while the growth pressure is set as 150 Torr and the growth temperature is set as 650° C.

First, the p-type InP cladding layer 3 with a carrier concentration of $1 \times 10^{18}$ atoms/cm$^3$, a bandgap wavelength of 1.13 µm, and a thickness of 50 nm is selectively grown on the exposed surface of the substrate 2 from the mask 46. Then, the n-type InGaAs guiding layer 3a with a carrier concentration of $1 \times 10^-$ atoms/cm$^3$, a bandgap wavelength of 1.13 µm, and a thickness of 20 nm is selectively grown on the layer 3. On the layer 3a, the n-type InGaAs guiding layer 3b with a carrier concentration of $1 \times 10^{18}$ atoms/cm$^3$, a bandgap wavelength of 1.2 µm, and a thickness of 50 nm is selectively grown.

Further, the undoped InGaAsP barrier sublayers and the undoped InGaAsP well sublayers are successively and selectively grown to be alternately stacked to each other on the n-type InGaAs guiding layer 3b, thereby forming the MQW active layer 4. The layer 4 has an optical emission wavelength of 1.55 µm and a total thickness of 90 nm.

On the active layer 4 thus formed, the p-type InGaAs guiding layer 5a with a carrier concentration of $1 \times 10^{18}$ atoms/cm$^3$, a bandgap wavelength of 1.2 µm, and a thickness of 50 nm. The p-type InGaAs guiding layer 5b with a carrier concentration of $1\times10^{18}$ atoms/cm$^3$, a bandgap wavelength of 1.13 μm, and a thickness of 20 nm is selectively grown on the layer 5a. The p-type InP cladding layer 5 with a carrier concentration of $5\times10^{17}$ atoms/cm$^3$ and a thickness of 70 nm is selectively grown on the layer 5b. Thus, the mesa structure 25 is formed to be commonly used by the laser 44a and the modulator 44b.

The subsequent process steps are the same as those of the method according to the second embodiment.

Through the above-explained fabrication method according to the third embodiment, for example, the bandgap wavelength of the active layer 4 was able to be set as 550 nm in the laser 44a and 1490 nm in the modulator 44b.

According to the inventors' test, with the photonic device 43 of the third embodiment, it was found that the DFB laser 44a oscillated at a very low threshold current of 3 mA, and that the obtainable 3-dB frequency band was 15 GHz or wider due to the use of the high-resistance semiconductor layers 31 and 32 in the current-constricting structure 26 of the laser 44a.

FOURTH EMBODIMENT

Figure 11:
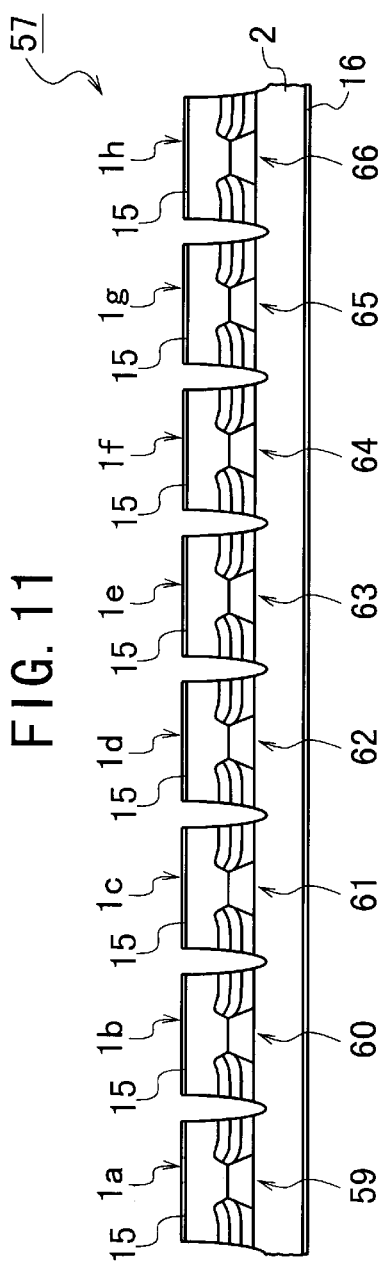
FIG. 11 is a partial cross-sectional view of a semiconductor photonic device according to a fourth embodiment, which is a micro-array of eight semiconductor lasers.

FIG. 11 shows the configuration of a semiconductor photonic device 57 according to a fourth embodiment, which is a micro-array of eight semiconductor lasers 1g, and 1h formed on the n-type InP substrate 2.

Figure 12:
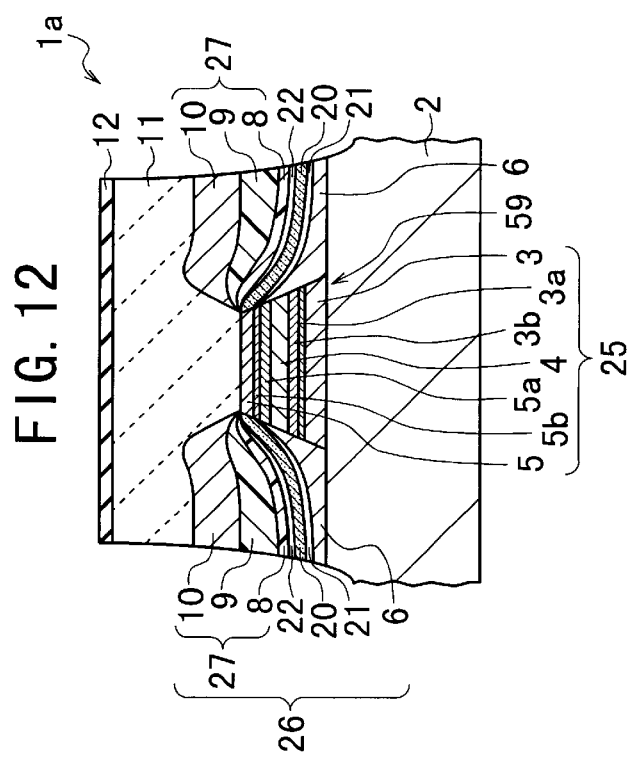
FIG. 12 is a partial cross-sectional view showing the configuration of the first one of the lasers of the semiconductor photonic device according to the fourth second embodiment of FIG. 11.

The lasers 1a, 1b, 1c, 1d, 1e, 1f, 1g, and 1h are used for the first to eighth channels 59, 60, 61, 62, 63, 64, 65, and 66, respectively. Although each of the lasers 1a, 1b, 1c, 1d, 1e, 1f, 1g, and 1h has the same configuration as that of the semiconductor laser 1 according to the first embodiment of FIG. 5, their optical emission wavelengths are different from each other. As an example, the configuration of the laser 1a is shown in FIG. 12, where the contact layer 14 and the p- and n-side electrodes 15 and 16 are omitted.

The semiconductor photonic device or the micro-array of lasers 57 according to the fourth embodiment is fabricated in the following way.

Figure 13:
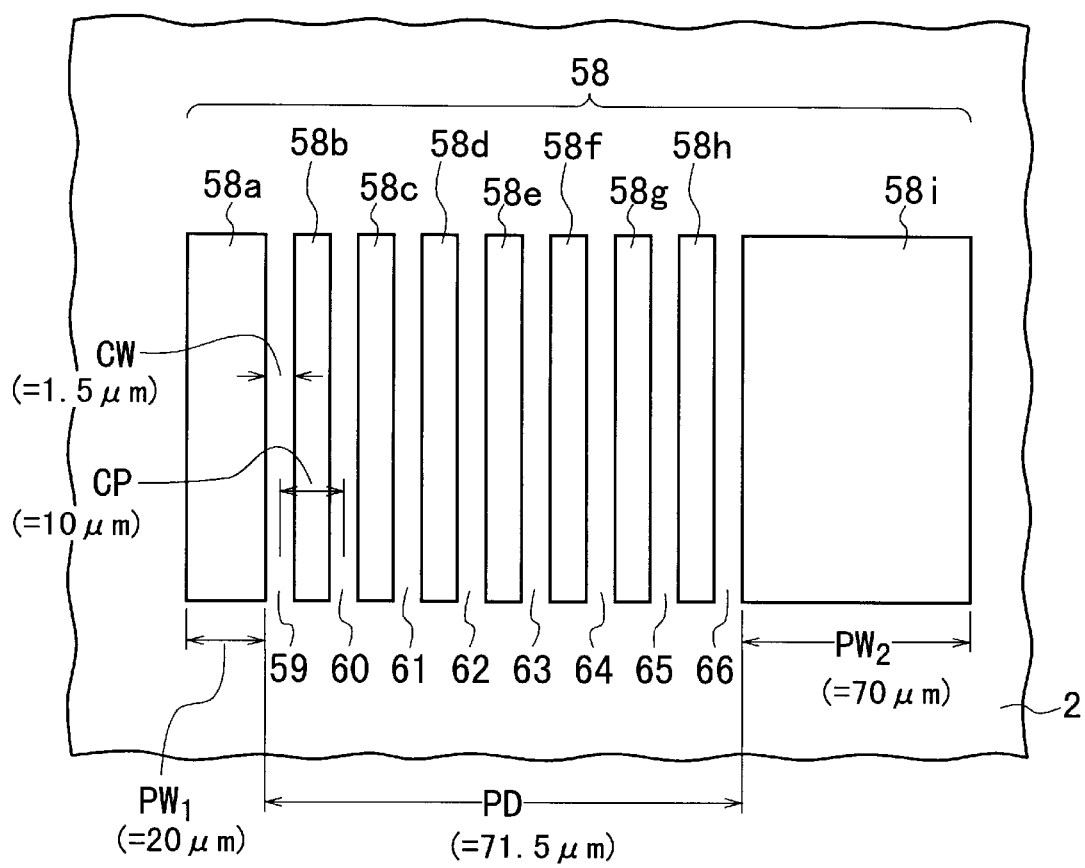
FIG. 13 is a partial plan view showing the fabrication method of the semiconductor photonic device according to the fourth embodiment of FIG. 11.

First, a SiO$_2$ layer (not shown) is formed on the upper surface of the n-type InP substrate 2 and then, it is patterned to have a plan shape as shown in FIG. 13 by photolithography and wet chemical etching, thereby forming a mask 58. The mask 58 has rectangular parts 58a, 58b, 58c, 58d, 58e, 58f, 58g, 58h, and 58i. The part 58a located at the left-hand end in FIG. 13 has a width PW$_1$ of 20 μm. The part 58i located at the right-hand end in FIG. 13 has a width PW$_2$ of 70 μm. These two parts 58a and 58i are apart from a distance PD of 71.5 μm. The parts 58b, 58c, 58d, 58e, 58f, 58g, 58h sandwiched by the parts 58a and 58i have equal widths and are arranged at a pitch CP of 10 μm. The pitch CP is equal to the pitch of the first to eighth channels 59 to 66. Adjoining two ones of the parts 58b, 58c, 58d, 58e, 58f, 58g, 58h are apart from equal distances CW of 1.5 μm. The distance CW is equal to the width of each of the channels 59 to 66.

Figure 14:
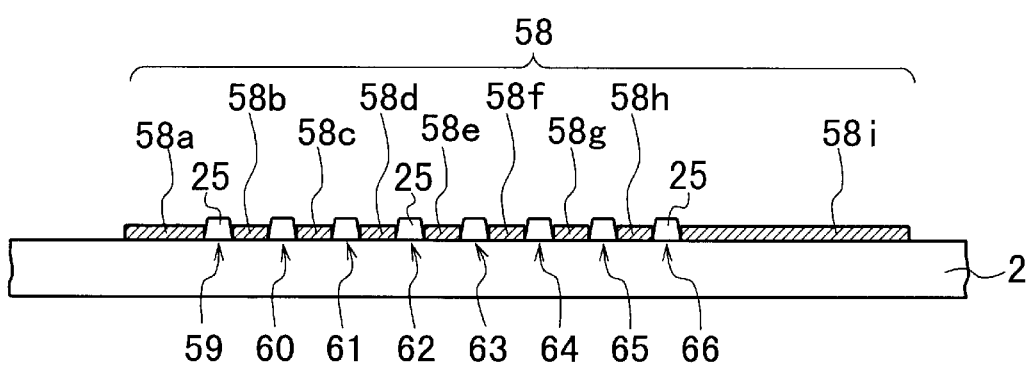
FIG. 14 is a partial cross-sectional view showing the fabrication method of the semiconductor photonic device according to the fourth embodiment of FIG. 11.

Subsequently, using the mask 56 thus formed, the mesa structures 25 for the first to eighth lasers 1a, 1b, 1c, 1d, 1e, 1f, 1g, and 1h are formed on the surface of the substrate 2 by selective MOVPE, as shown in FIG. 14. The MOVPE is carried out at the growth pressure of 150 Torr and the growth temperature of 650° C. The state at this stage is shown in FIG. 14.

Thereafter, through the same process steps as those in the method according to the first embodiment, the SiO$_2$ layer 19 is selectively formed on the tops of the first to eighth mesa structures 25, the multilayer current-constricting structure 26 is formed at each side of each of the mesa structures 25, the burying layer 11, the contact layer 12, and the SiO$_2$ layer 14 are formed. Next, to make it possible to separately drive the eight lasers 1a, 1b, 1c, 1d, 1e, 1f, 1g, and 1h, the eight p-side electrodes 15 are formed on the tops of the respective mesa structures 28. Finally, the common n-side electrode 16 is formed on the lower surface of the substrate 2. Thus, the semiconductor photonic device (i.e., the semiconductor micro-array lasers) 57 according to the fourth embodiment is completed.

With the method of fabricating the photonic device 57 according to the fourth embodiment, the mask 58 is asymmetric with respect to its center, in other words, the end parts 58a and 58i of the mask 58 are not equal in width to each other, as shown in FIG. 13. Therefore, the optical-emission wavelength of the lasers 1a, 1b, 1c, 1e, 1f, 1g, and 1h for the first to the eighth channels 59 to 66 increases in steps. As a result, for example, the optical emission wavelengths of the lasers 1a, 1b, 1c, 1e, 1f, 1g, and 1h can be set to vary from 1520 nm for the first channel 59 to 1600 nm for the eighth channel 66 at approximately equal intervals within the narrow area of approximately 60 μm. In other words, the eight lasers 1a, 1b, 1c, 1e, 1f, 1g, and 1h having the optical-emission wavelength difference of 80 nm can be arranged in the narrow area of approximately 80 μm.

The inventors' test gave the following results.

The length of the resonator (i.e., the waveguides formed by the mesa structures 25) of the eight lasers 1a to 1h was set as 400 μm. The front and rear ends of the resonator were set to be cleavage planes. In this case, the threshold currents of all the lasers 1a to 1h were as low as 4 mA or less, which is due to the good uniformity and the high performance of the current-constricting structures 26 of the lasers 1a to 1h. This means that the advantages of the invention exhibits conspicuously if the invention is applied to an array of semiconductor photonic elements, such as the device 57.

In the above-described fourth embodiment, the mask 58 has the asymmetric pattern as shown in FIG. 13. However, the invention is not limited to this case. The end parts 58a and 58i of the mask 58 may have equal widths, in which the lasers 1a to 1h have equal optical emission wavelengths. Similarly, the optical emission wavelengths of the lasers 1a to 1h may have a distribution that they are maximized or minimized at the laser or lasers located at the middle position.

Needless to say, the number of the lasers forming the array may be optionally changed.

FIFTH EMBODIMENT

Figure 15:
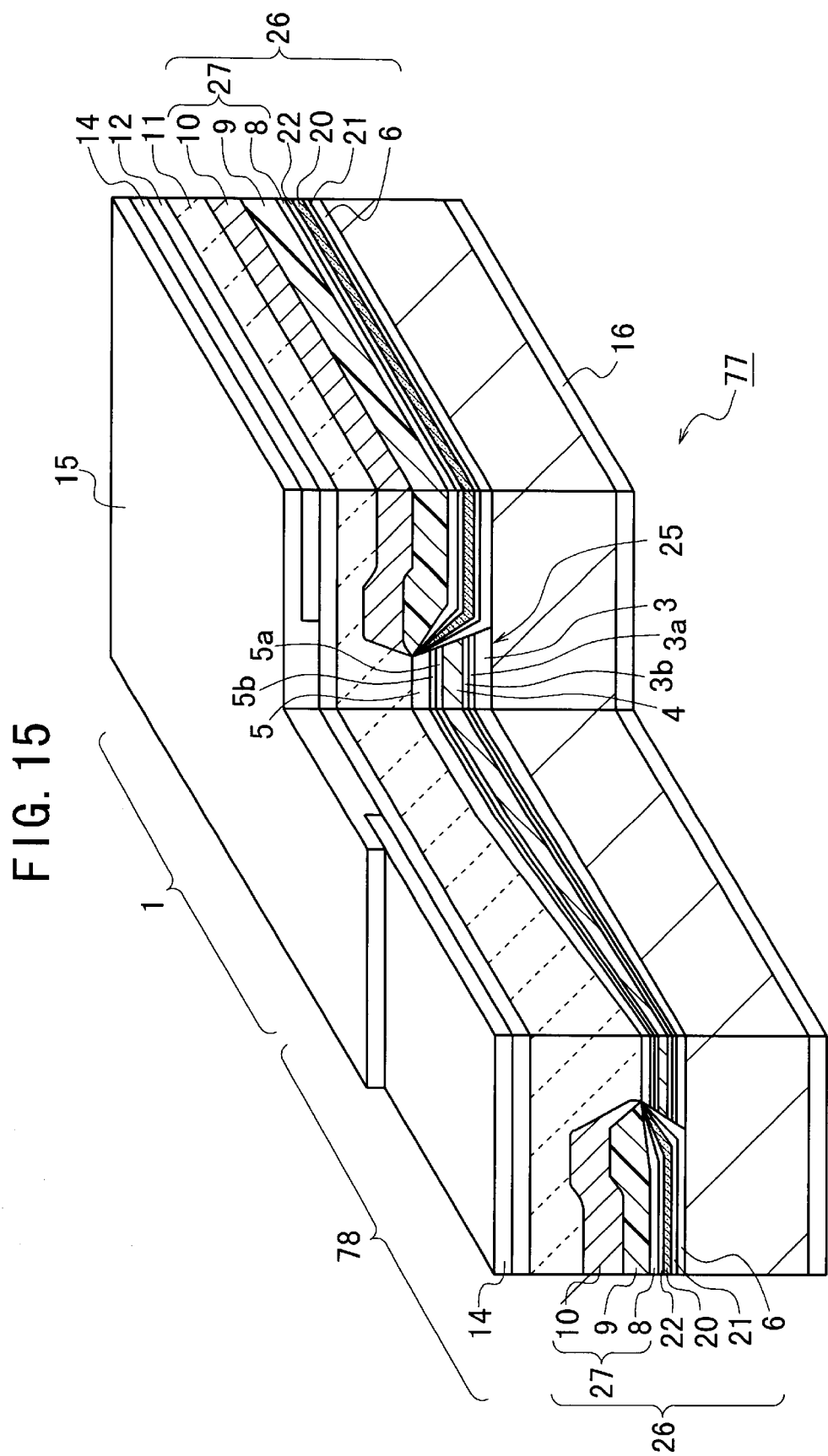
FIG. 15 is a partially-cutaway, perspective view of a semiconductor photonic device according to a fifth embodiment of the invention, which is comprised of a semiconductor laser and an optical waveguide serving as a spot-size converter.

FIG. 15 shows the configuration of a semiconductor photonic device 77, which is comprised of the semiconductor laser 1 according to the first embodiment of FIG. 5 and an optical waveguide 78 serving as a spot-size converter.

The waveguide 78 has the same configuration as that of the mesa structure 25 and the current-constricting structure 26 of the laser 1. However, as seen from FIG. 15, the thickness of the waveguide 38 decreases gradually from the connection point to the laser 1 to the light-emission end of the device 77. Also, the bandgap wavelength of the active layer 4 in the structure 25 decreases gradually from the connection point to the laser 1 to the light-emission end of the device 77.

Moreover, the p-side electrode 15 extends to be overlapped with the waveguide 78 by a width of approximately 50 m, thereby injecting the driving current for the laser 1 into the part of the waveguide 78. Thus, there is an additional advantage that optical absorption loss can be prevented from increasing at the transtion region where the composition of the active layer 4 changes between the laser 1 and the waveguide 78.

The semiconductor photonic device 77 according to the fifth embodiment is fabricated in the following way.

Figure 16A:
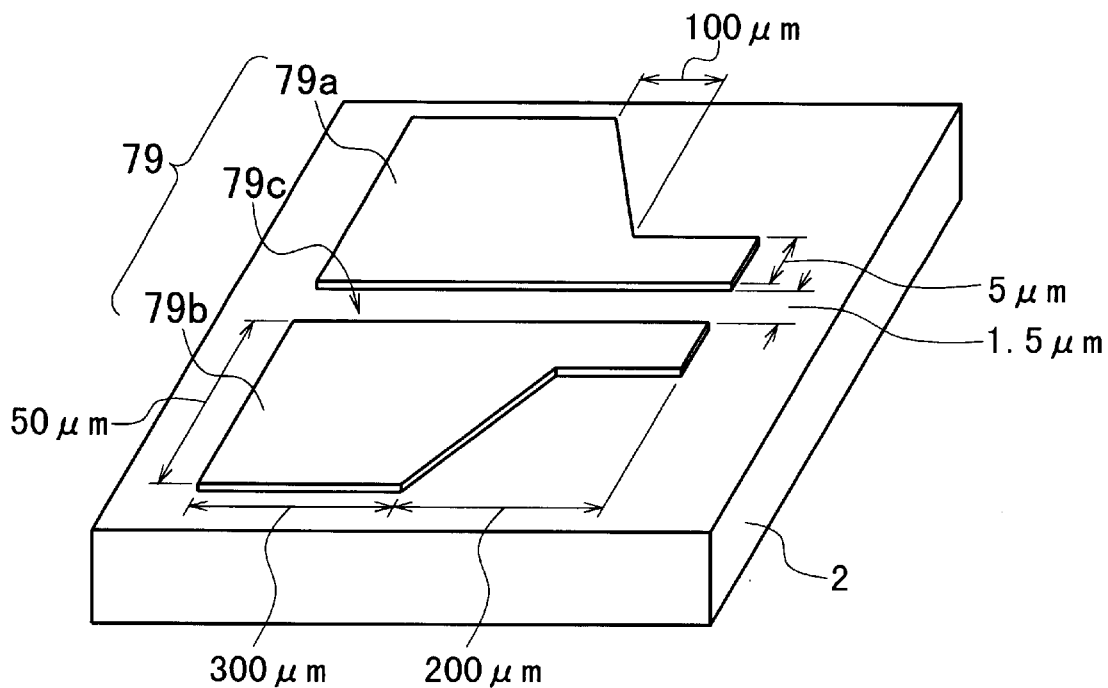
FIGS. 16A and 16B are partial perspective views showing the fabrication method of the semiconductor photonic device according to the fifth embodiment of FIG. 15, respectively.

First, a SiO$_2$ layer (not shown) is formed on the upper surface of the n-type InP substrate 2 and then, it is patterned to have a plan shape as shown in FIG. 16A by photolithography and wet chemical etching, thereby forming a mask 79. The mask 79 has two parts 79a and 79b and a strip-shaped opening 79c between the parts 79a and 79b. The parts 79a and 79b have symmetric plan shapes with respect to the opening 79c. The part 79a has a width of 50 μm in the laser area for the laser 1 and a varying width of 50 μm to 5 μm in the waveguide area for the waveguide 78. The waveguide area includes a tapered area in which the width decreases from 50 μm to 5 μm. The laser area has a length of 300 μm and the waveguide area has 200 μm, where the length of the tapered area is 100 μ. The opening 79c has a width of 1.5 μm.

Figure 16B:
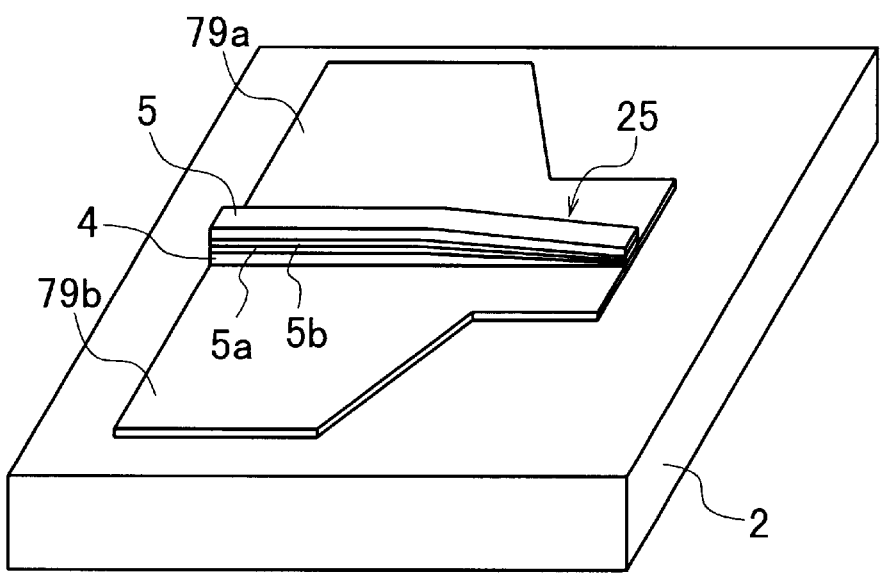

Subsequently, using the mask 79 thus formed, the mesa structure 25 used for the laser 1 and the waveguide 78 is formed on the surface of the substrate 2 by selective MOVPE, as shown in FIG. 16B. The MOVPE is carried out in the same condition as that of the first embodiment. The state at this stage is shown in FIG. 16B. Due to existence of the tapered area in the mask 79, the thickness of the mesa structure 25 decreases gradually in the waveguide area.

Thereafter, through the same process steps as those in the first embodiment, the SiO$_2$ layer 19 is selectively formed on the top of the mesa structure 25 thus formed, the multilayer current-constricting structure 26 is formed at each side of the structure 25, and then, the burying layer 11, the contact layer 12, and the SiO$_2$ layer 14 are formed successively Next, the p-side electrode 15 is formed on the top of the mesa structure 28 in the laser 1 so as to be overlapped with the waveguide 78 in the waveguide area. Finally, the n-side electrode 16 is formed on the lower surface of the substrate 2. Thus, the semiconductor photonic device (i.e., the semiconductor laser) 77 according to the fifth embodiment is completed.

With the method of fabricating the photonic device 57 according to the fifth embodiment, not only the side faces 25a of the mesa structure 25 but also the side faces of the waveguide 7B are formed to correspond to the smooth (111) B-planes. Also, the height or thickness of the waveguide 78 decreases gradually along its axial direction. As a result, the optical emission wavelength of the active layer 4 decreases gradually, thereby reducing the absorption of the propagating light in the waveguide 78. This means that the waveguide 78 has low scattering loss.

The inventors' test gave the following results.

The front end of the device 1 was set to be a cleavage plane and a high-reflectance coating with the 95% reflectance was applied to the rear end thereof. In this case, the threshold current of the laser 1 was 4 mA and 12 mA at 25° C. and 85° C., respectively.

Moreover, the emission angle of the emitted light from the front end of a popular laser element is 30° or greater in both the lateral and vertical directions. However, unlike this, the emission angle of the emitted light from the front end of the device 77 was as narrow as 10°. This was because the tapered waveguide 78 was integrated with the laser 1 on the InP substrate 2 and the height of the waveguide 78 decreased gradually toward the output end of the light, thereby making the optical confinement weak to thereby expand the emission field of the light. Accordingly, the difference of the field from that of an optical fiber became small and as a result, there arose an additional advantage that optical coupling between the device 77 and an optical fiber was able to be improved. For example, the obtainable minimum coupling loss of the device 77 with a single-mode optical fiber was improved to be 1.5 dB.

In the above-explained first and second embodiments, the laser 1 or 1A is used. However, any other type of semiconductor photonic elements such as a distributed Bragg-reflection laser or DFB laser and semiconductor optical amplifier may be used.

In the above-explained first to fifth embodiments, the dielectric layer 20 serving as the current-blocking layer is formed by oxidizing an InAlAs layer. However, the invention is not limited thereto. An AlAsSb layer, the combination of an AlAs sublayer and an InAlAs sublayer with the superlattice structure, or the combination of an AlAs sublayer and an AlAsSb sublayer with the superlattice structure may be used for this purpose.

Although the laser element is combined with an optical modulator or an optical waveguide, it may be combined with any other optical element, such as a semiconductor optical switch and a semiconductor optical amplifier.

The number of the dielectric layer 20 of the current-constricting structure 26 is unity in the above embodiments. However, it may be set as two or more.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor photonic element comprising:
 (a) a semiconductor substrate having a first surface and a second surface opposite to the first surface;
 (b) a mesa structure formed on said first surface of said substrate to extend in a specific direction;
   said mesa structure including an active layer and a pair of p- and n-type cladding layers located respectively at top and bottom sides of said active layer, forming a double heterojunction;
 (c) a multilayer current-constricting structure for constricting an injection current;
   said current-constricting structure being formed at each side of said mesa structure to expose a top of said mesa structure from said current-constricting structure;
   said current-constricting structure comprising a first current-blocking part and a second current-blocking part;
   said first current-blocking part having a dielectric current-blocking layer that extends to said mesa structure;
   said dielectric current-blocking layer being contacted with top edges of said mesa structure;
   said second current-blocking part having a semiconductor current-blocking layer; and
 (d) a semiconductor burying layer formed to cover said mesa structure and said multilayer current-constricting structure;
   said semiconductor burying layer being contacted with said top of said mesa structure.

2. The element according to claim 1, wherein said second current-blocking part has three stacked semiconductor current-blocking layers of p-, n-, and p-type or n-, p-, and n-type.

3. The element according to claim 1, wherein said semiconductor current-blocking layer of said second current-blocking part has a semi-insulating property.

4. The element according to claim 1, wherein said semiconductor current-blocking layer is doped with an impurity to raise its electric resistance.

5. The element according to claim 1, wherein said first current-blocking part of said current-constricting structure is located to be near said substrate and said second current-blocking part of said current-constricting structure is located to be apart from said substrate.

6. The element according to claim 1, wherein a space is formed between said first surface of said substrate and said current-constricting structure;

said space being filled with a semiconductor layer formed on said first surface of said substrate.

7. The element according to claim 1, wherein said mesa structure has a plan shape of a strip with a width of 10 $\mu$m or less;

and wherein each side face of said mesa structure corresponds to the (111) B-plane.

8. The element according to claim 1, wherein said dielectric current-blocking layer of said first current-blocking part is made of a semiconductor material containing Al.

9. The element according to claim 8, wherein said dielectric current-blocking layer of said first current-blocking part is made of one selected from the group consisting of InAlAs, AlAsSb, the combination of an AlAs sublayer and an InAlAs sublayer with the superlattice structure, and the combination of an AlAs sublayer and an AlAsSb sublayer with the superlattice structure.

10. The element according to claim 8, wherein said dielectric current-blocking layer of said first current-blocking part is made of an InAlAs or AlAsSb layer.

11. The element according to claim 1, wherein said dielectric current-blocking layer of Said first current-blocking part is sandwiched by a pair of InGaAsP layers or a pair of InGaAs layers.

12. The element according to claim 1, wherein said dielectric current-blocking layer of said first current-blocking part has a thickness of 10 to 100 nm.

13. A semiconductor photonic device comprising:

a plurality of said semiconductor photonic elements according to claim 1 formed on said substrate; and said plurality of said elements constitute a laser array.

* * * * *